(12) United States Patent
Kushner et al.

(10) Patent No.: US 10,700,187 B2
(45) Date of Patent: Jun. 30, 2020

(54) TILED LATERAL THYRISTOR

(71) Applicant: Silanna Asia Pte Ltd, Singapore (SG)

(72) Inventors: Vadim Kushner, Solana Beach, CA (US); Nima Beikae, Laguna Niguel, CA (US)

(73) Assignee: Silanna Asia Pte Ltd, Singapore (SG)

( * ) Notice: Subject to any disclaimer, the term of this patent is extended or adjusted under 35 U.S.C. 154(b) by 36 days.

(21) Appl. No.: 15/993,384

(22) Filed: May 30, 2018

(65) Prior Publication Data

US 2019/0371924 A1 Dec. 5, 2019

(51) Int. Cl.

| | |
|---|---|
| *H01L 29/74* | (2006.01) |
| *H01L 27/06* | (2006.01) |
| *H01L 27/02* | (2006.01) |
| *H01L 23/528* | (2006.01) |
| *H01L 21/8228* | (2006.01) |
| *H01L 27/12* | (2006.01) |
| *H01L 21/84* | (2006.01) |

(52) U.S. Cl.
CPC ...... *H01L 29/7436* (2013.01); *H01L 21/8228* (2013.01); *H01L 21/84* (2013.01); *H01L 23/528* (2013.01); *H01L 27/0207* (2013.01); *H01L 27/067* (2013.01); *H01L 27/0623* (2013.01); *H01L 27/1203* (2013.01)

(58) Field of Classification Search
CPC ......... H01L 29/7436; H01L 2924/1301; H01L 2924/13034; H01L 27/0262; H01L 21/8228; H01L 27/0623; H01L 27/067; H01L 27/1027; H01L 27/0817; H01L 29/73; H01L 29/083–0839; H01L 29/1004–102; H01L 29/41708–41716; H01L 29/66363; H01L 29/66393; H01L 29/74

See application file for complete search history.

(56) References Cited

U.S. PATENT DOCUMENTS

| | | |
|---|---|---|
| 6,737,722 B2 | 5/2004 | Yamamoto et al. |
| 7,897,995 B2 | 3/2011 | Yang et al. |
| 7,932,581 B2 | 4/2011 | Yang et al. |
| 8,115,280 B2 | 2/2012 | Chen et al. |
| 8,415,745 B2 | 4/2013 | Chao |

(Continued)

FOREIGN PATENT DOCUMENTS

| | | |
|---|---|---|
| JP | 2010010389 A | 1/2010 |
| KR | 1020160055381 A | 5/2016 |
| WO | 2013131908 A1 | 9/2013 |

OTHER PUBLICATIONS

International Search Report dated Aug. 5, 2019 for PCT Patent Application No. PCT/IB2019/052574.
Office Action dated Mar. 31, 2020 for U.S. Appl. No. 15/955,040.

*Primary Examiner* — Shaun M Campbell
*Assistant Examiner* — Aneta B Cieslewicz
(74) *Attorney, Agent, or Firm* — MLO, a professional corp.

(57) ABSTRACT

A thyristor tile includes first and second PNP tiles and first and second NPN tiles. Each PNP tile is adjacent to both NPN tiles, and each NPN tile is adjacent to both PNP tiles. A thyristor includes a plurality of PNP tiles and a plurality of NPN tiles. The PNP and NPN tiles are arranged in an alternating configuration in both rows and columns. The PNP tiles are oriented perpendicular to the NPN tiles. Interconnect layers have a geometry that enables even distribution of signals to the PNP and NPN tiles.

21 Claims, 12 Drawing Sheets

(56) References Cited

U.S. PATENT DOCUMENTS

| | | |
|---|---|---|
| 8,525,300 B2 | 9/2013 | Kuo et al. |
| 8,981,521 B1 | 3/2015 | Wang et al. |
| 9,123,558 B2 | 9/2015 | Fan et al. |
| 9,299,817 B2 | 3/2016 | Yoo et al. |
| 9,324,705 B2 | 4/2016 | Ko et al. |
| 9,536,788 B1 | 1/2017 | Ning et al. |
| 9,640,527 B2 | 5/2017 | Lin et al. |
| 9,780,089 B2 | 10/2017 | Tsai et al. |
| 9,831,233 B2 | 11/2017 | Salcedo et al. |
| 9,997,510 B2 | 6/2018 | Tu et al. |
| 10,224,402 B2 | 3/2019 | Lavrovskaya et al. |
| 2003/0052387 A1 | 3/2003 | Boeck et al. |
| 2004/0164356 A1* | 8/2004 | Josef Mergens .... H01L 27/0262 257/360 |
| 2006/0011939 A1* | 1/2006 | Mohn ................. H01L 27/0262 257/107 |
| 2010/0038677 A1 | 2/2010 | Chiang et al. |
| 2013/0119433 A1 | 5/2013 | Wang |
| 2013/0228824 A1* | 9/2013 | Morishita ............... H01L 29/74 257/173 |
| 2016/0056146 A1 | 2/2016 | Li et al. |
| 2017/0309703 A1 | 10/2017 | Babcock et al. |
| 2017/0317197 A1 | 11/2017 | Tseng |
| 2018/0012961 A1 | 1/2018 | Aharoni |

\* cited by examiner

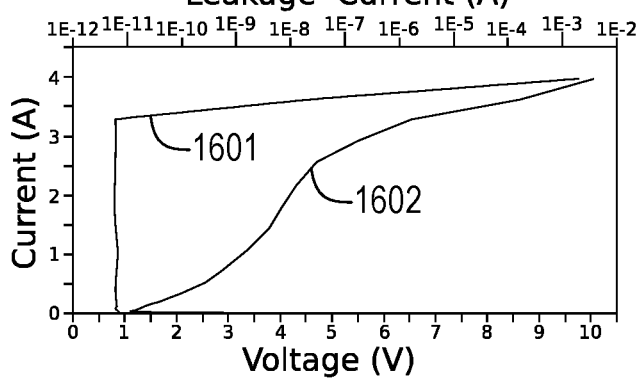
Fig. 16  4x4 Tiled SCR Leakage Current (A)
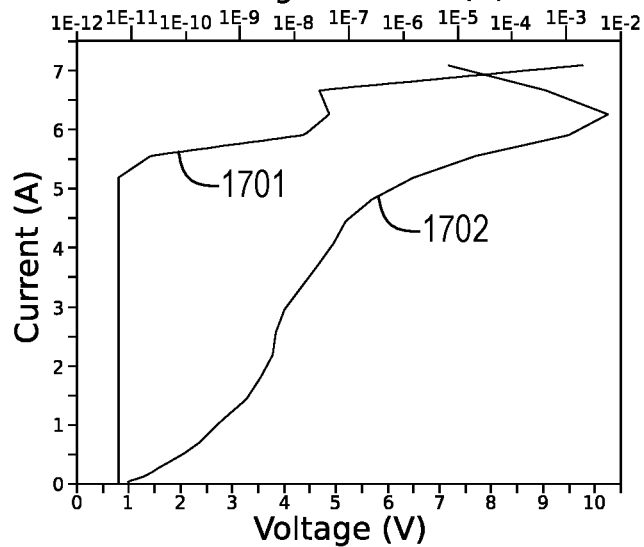
Fig. 17  5x5 Tiled SCR Leakage Current (A)
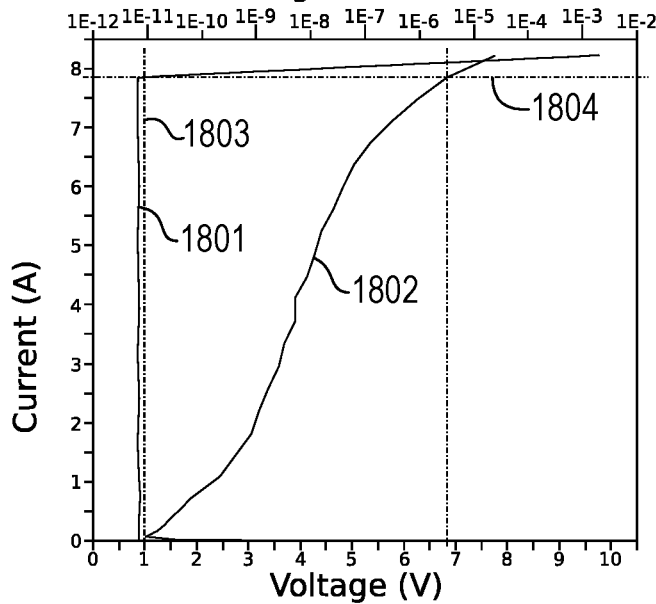
Fig. 18  6x6 Tiled SCR Leakage Current (A)

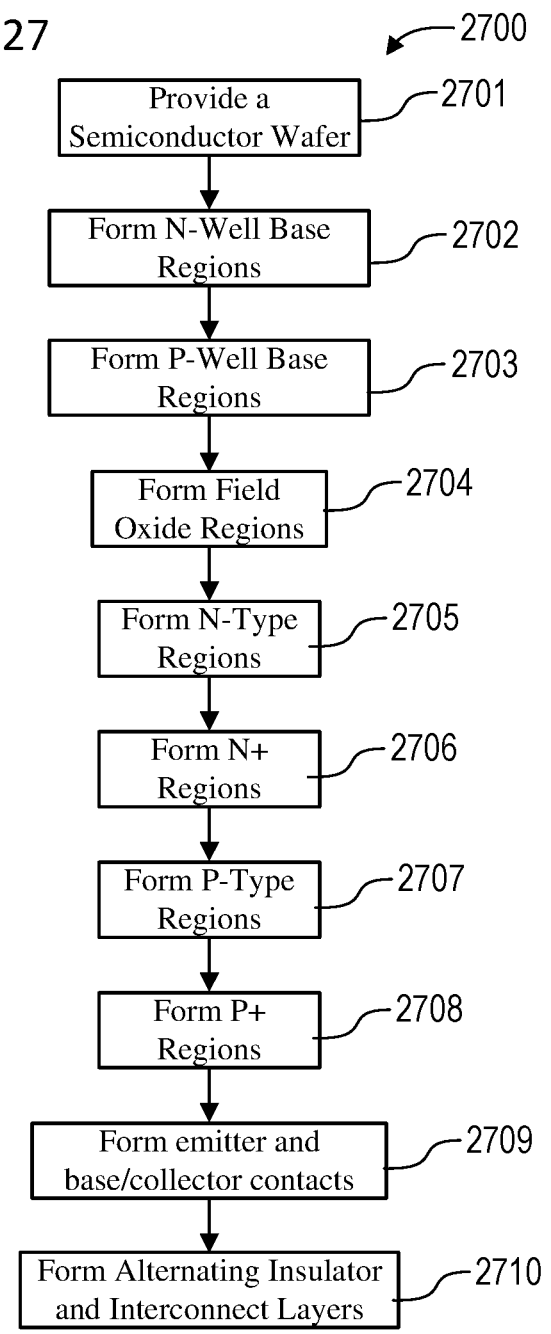

TILED LATERAL THYRISTOR

BACKGROUND

There is an advantage to having a general design for an electronic component, such as a thyristor, or silicon-controlled rectifier (SCR), that allows for the same general design to be adapted for use in a wide variety of design applications. For example, spatial constraints within an overall integrated circuit layout can severely restrict a design choice for placement and layout of the thyristor device, thereby potentially adversely affecting desired performance characteristics thereof.

Additionally, it is generally very difficult to make a thyristor, or SCR, on a semiconductor-on-insulator (SOI) substrate or platform. However, given the prevalence of SOI technologies, it would be advantageous to be able to form a thyristor device on an SOI wafer or substrate.

SUMMARY

In accordance with some embodiments, a thyristor tile includes first and second PNP tiles and first and second NPN tiles. Each PNP tile is adjacent to both NPN tiles; and each NPN tile is adjacent to both PNP tiles.

In some embodiments, the first and second PNP tiles have a first orientation; and the first and second NPN tiles have a second orientation that is perpendicular to the first orientation.

In some embodiments, each of the first and second PNP tiles have an N-type base region and a P-type emitter region aligned in the first orientation; and each of the first and second NPN tiles have a P-type base region and an N-type emitter region aligned in the second orientation.

In some embodiments, each N-type base region is aligned in the first orientation with the N-type emitter region of one of the first and second NPN tiles and is an N-type collector region of that NPN tile; and each P-type base region is aligned in the second orientation with the P-type emitter region of one of the first and second PNP tiles and is a P-type collector region of that PNP tile.

In some embodiments, the first and second PNP tiles each have a second N-type base region aligned in the first orientation with the first N-type base region and the P-type emitter region; and the first and second NPN tiles each have a second P-type base region aligned in the second orientation with the first P-type base region and the N-type emitter region.

In some embodiments, the thyristor tile further includes a first interconnect layer that electrically connects the N-type base regions of the first and second PNP tiles; a second interconnect layer that electrically connects the P-type base regions of the first and second NPN tiles; a third interconnect layer that electrically connects the N-type emitter regions of the first and second NPN tiles; and a fourth interconnect layer that electrically connects the P-type emitter regions of the first and second PNP tiles.

In some embodiments, the thyristor tile is formed with a horizontal longitudinal dimension and a horizontal lateral dimension; the first interconnect layer includes 1) first island traces that electrically connect to the P-type emitter regions, 2) second island traces that electrically connect to the N-type emitter regions, 3) third island traces that electrically connect to the P-type base regions, and 4) first lateral, longitudinal and diagonal traces that electrically connect to the N-type base regions and that surround the first, second and third island traces; the second interconnect layer includes 1) fourth island traces that electrically connect to the P-type emitter regions, 2) fifth island traces that electrically connect to the N-type emitter regions, and 3) second lateral, longitudinal and diagonal traces that electrically connect to the P-type base regions and that surround the fourth and fifth island traces; and the third interconnect layer includes 1) sixth island traces that electrically connect to the P-type emitter regions, and 2) first and second sets of diagonal traces that electrically connect to the N-type emitter regions that are aligned along the same diagonals and that surround the sixth island traces.

In some embodiments, the first lateral, longitudinal and diagonal traces form first rectangular structures that surround the first island traces and form first octagonal structures that surround the second and third island traces; the second lateral, longitudinal and diagonal traces form second rectangular structures that surround the fifth island traces and form second octagonal structures that surround the fourth island traces; and the first and second sets of diagonal traces form rhombus structures that surround the sixth island traces.

In some embodiments, each NPN tile is formed within a P-well base; each PNP tile is formed within an N-well base; and the P-well bases are adjacent to the N-well bases, except at a corner between all four N-wells and P-wells.

In some embodiments, the first PNP tile is in a first quadrant of the thyristor tile; the first NPN tile is in a second quadrant of the thyristor tile, the second quadrant being located adjacent to the first quadrant; the second PNP tile is in a third quadrant of the thyristor tile, the third quadrant being located adjacent to the second quadrant, and the third quadrant being diagonally located from the first quadrant; and the second NPN tile is in a fourth quadrant of the thyristor tile, the fourth quadrant being located adjacent to the first and third quadrants, and the fourth quadrant being diagonally located from the second quadrant.

In some embodiments, an improved thyristor includes a plurality of the thyristor tile of claim 10. The first NPN tile in the second quadrant of a first one of the plurality of the thyristor tile is located adjacent to the first PNP tile in the first quadrant of a second one of the plurality of the thyristor tile. A first N-type base region of the first PNP tile in the first quadrant of the second one of the plurality of the thyristor tile is a first N-type collector region of the first NPN tile in the second quadrant of the first one of the plurality of the thyristor tile. In some embodiments, the first NPN tile in the second quadrant of the first one of the plurality of the thyristor tile is located adjacent to the second PNP tile in the third quadrant of a third one of the plurality of the thyristor tile; and a first P-type base region of the first NPN tile in the second quadrant of the first one of the plurality of the thyristor tile is a first P-type collector region of the second PNP tile in the third quadrant of the third one of the plurality of the thyristor tile.

In accordance with some embodiments, an improved thyristor includes a plurality of PNP tiles and a plurality of NPN tiles. The PNP tiles and the NPN tiles are arranged in an alternating configuration in both rows and columns.

In some embodiments, each PNP tile is adjacent to at least two of the NPN tiles; and each NPN tile is adjacent to at least two of the PNP tiles.

In some embodiments, each PNP tile has at least one base region that is also a collector region of an adjacent NPN tile; and each NPN tile has at least one base region that is also a collector region of an adjacent PNP tile.

In some embodiments, the PNP tiles have a first orientation; and the NPN tiles have a second orientation that is perpendicular to the first orientation.

In some embodiments, each PNP tile has first and second N-type base regions and a P-type emitter region, the P-type emitter region being located between the first and second N-type base regions, and the first and second N-type base regions and the P-type emitter region being aligned in the first orientation; and each NPN tile has first and second P-type base regions and an N-type emitter region, the N-type emitter region being located between the first and second P-type base regions, and the first and second P-type base regions and the N-type emitter region being aligned in the second orientation.

In some embodiments, at least one of the first and second N-type base regions of each PNP tile is aligned in the first orientation with the N-type emitter region of an adjacent one of the NPN tiles; the at least one of the first and second N-type base regions of each PNP tile is also an N-type collector region of the adjacent one of the NPN tiles; at least one of the first and second P-type base regions of each NPN tile is aligned in the second orientation with the P-type emitter region of an adjacent one of the PNP tiles; and the at least one of the first and second P-type base regions of each NPN tile is also a P-type collector region of the adjacent one of the PNP tiles.

In some embodiments, the thyristor further includes a first interconnect layer that electrically connects the N-type base regions of the PNP tiles and the N-type collector regions of the NPN tiles, the first interconnect layer including first traces that surround the P-type emitter regions, the N-type emitter regions, and the P-type base regions in a first plane vertically offset therefrom; a second interconnect layer that electrically connects the P-type base regions of the NPN tiles and the P-type collector regions of the PNP tiles, the second interconnect layer including second traces that surround the P-type emitter regions and the N-type emitter regions in a second plane vertically offset therefrom; a third interconnect layer that electrically connects the N-type emitter regions of the NPN tiles, the third interconnect layer including third traces that surround the P-type emitter regions in a third plane vertically offset therefrom; and a fourth interconnect layer that electrically connects the P-type emitter regions of the PNP tiles.

In some embodiments, the first traces form first rectangular structures that surround the P-type emitter regions and form first octagonal structures that surround the N-type emitter regions and the P-type base regions; the second traces form second rectangular structures that surround the N-type emitter regions and form second octagonal structures that surround the P-type emitter regions; and the third traces include diagonal traces that form rhombus structures that surround the P-type emitter regions.

In some embodiments, the first, second, third and fourth interconnect layers are configured to receive an electrical connection thereto at any point along any peripheral side thereof for electrical interconnections to other electronic components of an overall electronic circuit of which the thyristor is a part.

In some embodiments, the PNP tiles and the NPN tiles are formed within a CMOS process flow simultaneously with portions of MOSFET devices of an overall electronic circuit of which the thyristor is a part.

BRIEF DESCRIPTION OF THE DRAWINGS

FIGS. 16-18 are simplified current-voltage graphs showing the results of transmission line pulse (TLP) tests, for example, horizontal or lateral thyristor devices formed with a plurality of the horizontal or lateral thyristor tile shown in FIGS. 2-4, in accordance with some embodiments.

FIG. 27 is a simplified flowchart for an example method of fabricating the thyristor tile shown in FIGS. 1-4.

DETAILED DESCRIPTION

Figure 1:
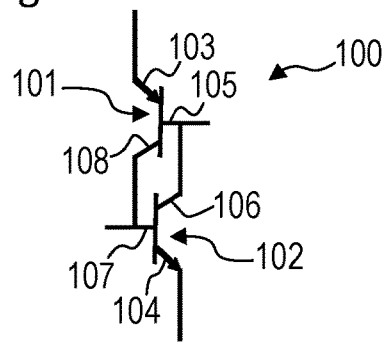
FIG. 1 is a simplified schematic diagram of a thyristor or semiconductor-controlled rectifier (SCR).
Figure 2:
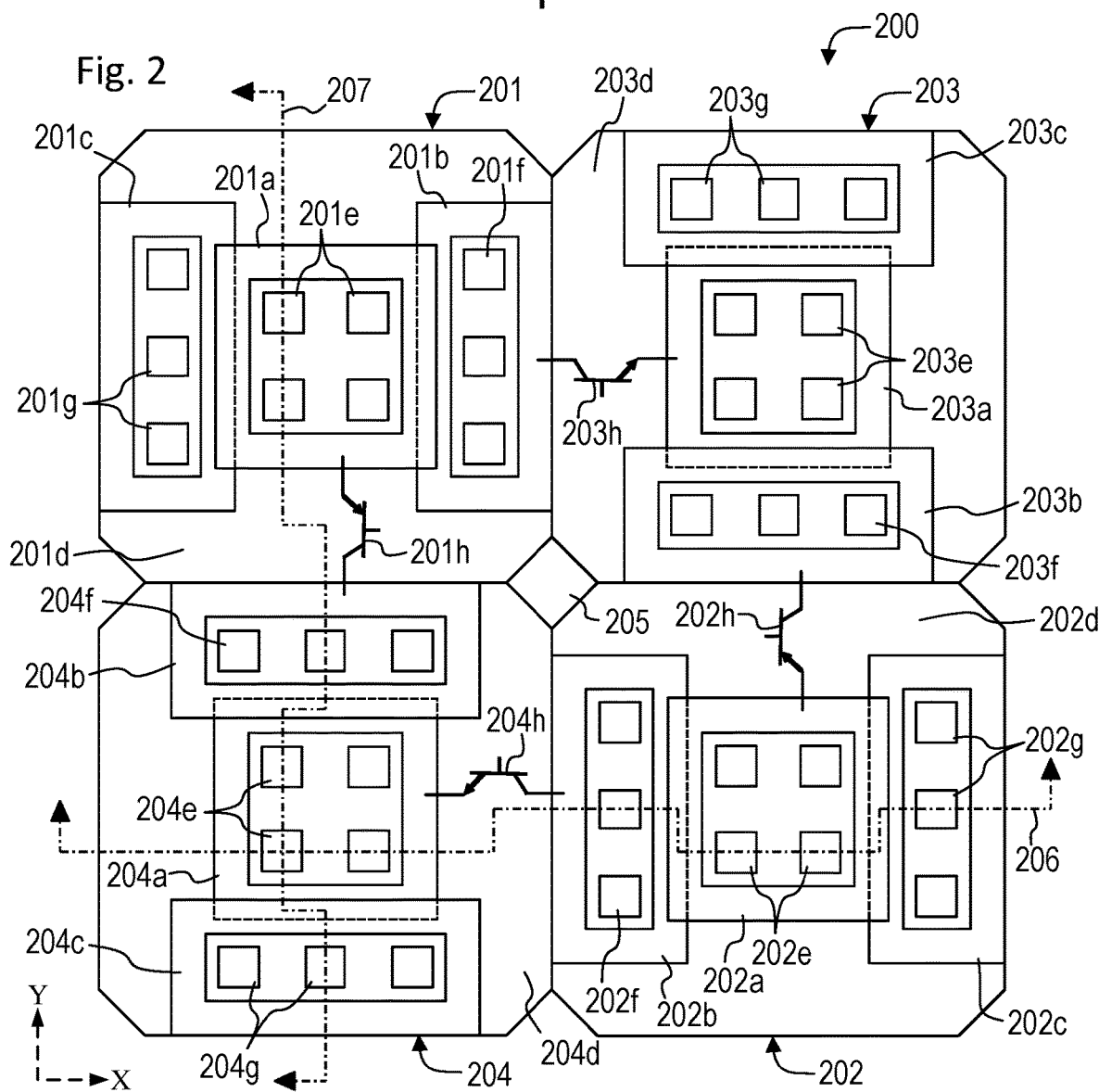
FIG. 2 is a simplified top view layout of an example horizontal or lateral thyristor tile, in accordance with some embodiments.

A simplified schematic diagram of a thyristor 100 is shown in FIG. 1; and a simplified top view layout of an example horizontal or lateral thyristor tile 200 is shown in FIG. 2, in accordance with some embodiments. Disclosed herein is an improved design, geometry, structure, placement or layout for the thyristor 100 incorporating multiple instances of the horizontal or lateral thyristor tiles 200 formed from individual PNP tiles (or "PNP BJT sub-tiles") and NPN tiles (or "NPN BJT sub-tiles"), as described below. The design of the thyristor tiles 200 allows for a high level of flexibility in design-stage control over device placement and layout, structural feature geometry, and operating parameters of the resulting horizontal or lateral thyristor 100 that can be easily incorporated within the spatial constraints of an overall integrated circuit layout with little or no adverse effects on the available circuit area, including embodiments advantageously formed on a semiconductor-on-insulator (SOI) wafer. Additionally, at least some portions of the thyristor 100 may be formed simultaneously with, i.e., during an overall complementary metal-oxide-semiconductor (CMOS) process flow, some regions of metal-oxide-semiconductor field-effect transistors (MOSFETs) incorporated in the overall electronic circuit within an integrated circuit of which the thyristor 100 is a part, thereby enhancing ease of incorporation of the thyristor 100 into the overall electronic circuit, particularly for integrated circuits formed in and on an SOI wafer. Furthermore, electrical interconnect (or metal) layers of the thyristor 100 allow for electrical connections to the thyristor at any or all sides thereof; thereby further enhancing the ease with which the thyristor 100 can be incorporated in the overall electronic circuit. In addition, the design or configuration of the thyristor 100 (including the thyristor tiles 200 and the electrical interconnect layers) allows for flexible triggering thereof. Additional advantages or improvements will be described below or will be apparent from the following description.

As shown in FIG. 1, the thyristor 100 generally includes a PNP BJT (bipolar junction transistor) device 101 and an NPN BJT device 102. The PNP BJT device 101 includes a PNP P-type emitter 103, and the NPN BJT device 101 includes an NPN N-type emitter 104. Additionally, the PNP BJT device 101 includes a PNP N-type base 105 and the NPN BJT device 102 includes an NPN N-type collector 106 that are formed or connected together as an N-type base/collector (or a PNP-base/NPN-collector) 105/106. Also, the NPN BJT device 102 includes an NPN P-type base 107 and the PNP BJT device 101 includes a PNP P-type collector 108 that are formed or connected together as a P-type base/collector (or an NPN-base/PNP-collector) 107/108.

As shown in FIG. 2, the thyristor tile 200 generally includes first and second PNP tiles 201 and 202 and first and second NPN tiles 203 and 204, which are not necessarily drawn to scale. Each PNP tile 201 and 202 is adjacent to both NPN tiles 203 and 204, and each NPN tile 203 and 204 is adjacent to both PNP tiles 201 and 202. However, the PNP tiles 201 and 202 are not adjacent to each other, and the NPN tiles 203 and 204 are not adjacent to each other. Instead, the PNP tiles 201 and 202 are offset diagonally from each other (e.g., top left to bottom right), and the NPN tiles 203 and 204 are offset diagonally from each other (e.g., top right to bottom left). It is understood, however, that the specific top/bottom and left/right locations for the tiles 201-204 are provided for illustrative and explanatory purposes only since the relative locations for the PNP tiles 201 and 202 can be switched with that of the NPN tiles 203 and 204.

Additionally, the thyristor tile 200 may be part of an overall horizontal or lateral thyristor device, which further includes a plurality of thyristor tiles (not shown, but each similar to 200), such that PNP tiles (each similar to 201 or 202) and NPN tiles (each similar to 203 or 204) are arranged in an alternating configuration in both rows and columns, as described below with respect to FIGS. 5-7. Thus, each PNP or NPN type of tile is adjacent to at least two tiles of the opposite type (e.g., two tiles at a row/column corner, three tiles at a row or column edge, or four tiles within an interior of the rows and columns).

Each PNP tile 201 and 202 generally includes a P-type emitter region 201a and 202a, a first N-type base region 201b and 202b, a second N-type base region 201c and 202c, an N-well base region 201d and 202d, emitter contacts 201e and 202e, first base contacts 201f and 202f, and second base contacts 201g and 202g. Similarly, each NPN tile 203 and 204 generally includes an N-type emitter region 203a and 204a, a first P-type base region 203b and 204b, a second P-type base region 203c and 204c, a P-well base region 203d and 204d, emitter contacts 203e and 204e, first base contacts 203f and 204f, and second base contacts 203g and 204g. The emitter regions 201a, 202a, 203a and 204a are square shaped structures in the center of the N-well and P-well base regions 201d, 202d, 203d and 204d, respectively. The base regions 201b/c, 202b/c, 203b/c and 204b/c are rectangles adjacent to either the longitudinal or the lateral edges of the N-well and P-well base regions 201d, 202d, 203d and 204d, respectively. The emitter and base regions are, thus, symmetrical with respect to the center of the tiles 201-204. The resulting structures are, thus, nearly identical, but rotated 90 degrees or oriented perpendicular to each other. Additional elements or details may not be shown for simplicity; whereas other elements may be shown, but not labeled to prevent overcrowding of the drawing.

For each PNP or NPN tile 201-204, the corresponding collector region is provided by an adjacent P-type or N-type base region of an adjacent PNP or NPN tile 201-204. For example, the first N-type base region 201b and 202b of each PNP tile 201 and 202 is also an N-type collector region for the adjacent NPN tile 203 and 204, respectively. Similarly, the first P-type base region 203b and 204b of each NPN tile 203 and 204 is also a P-type collector region for the adjacent PNP tile 202 and 201, respectively. Additionally, since the thyristor tile 200 may be part of an overall horizontal or lateral thyristor device, which further includes a plurality of thyristor tiles (not shown, but each similar to 200), the second N-type base region 201c and 202c of each PNP tile 201 and 202 may also be an N-type collector region for another adjacent NPN tile (similar to 203 and 204), unless the PNP tile 201 or 202 is at an edge or corner of the overall thyristor device, such that there is no additional NPN tile adjacent to the second N-type base region 201c or 202c. Similarly, the second P-type base region 203c and 204c of each NPN tile 203 and 204 may also be a P-type collector region for another adjacent PNP tile (similar to 201 and 202), unless the NPN tile 203 or 204 is at an edge or corner of the overall thyristor device, such that there is no additional PNP tile adjacent to the second P-type base region 203c or 204c. Therefore, the base regions 201b/c, 202b/c, 203b/c and 204b/c may also be referred to herein as collector regions 201b/c, 202b/c, 203b/c and 204b/c or base/collector regions 201b/c, 202b/c, 203b/c and 204b/c (for each base region 201b/c, 202b/c, 203b/c or 204b/c that is also a collector region). In a similar vein, the base contacts 201f/g, 202f/g, 203f/g and 204f/g (corresponding to the base regions 201b/c, 202b/c, 203b/c and 204b/c, respectively) may also be referred to herein as collector contacts 201f/g, 202f/g, 203f/g and 204f/g or base/collector contacts 201f/g, 202f/g, 203f/g and 204f/g (for each corresponding base region that is also a collector region) Additionally, although the tiles 201-204 are described as PNP and NPN BJT tiles, it is understood that the collector region for each type of BJT tile lies outside the BJT tile in an adjacent BJT tile of the opposite type.

The emitter regions 201a, 202a, 203a and 204a and the base/collector regions 201b/c, 202b/c, 203b/c and 204b/c are generally formed as structural islands in the corresponding N-well and P-well base regions 201d, 202d, 203d and 204d. The N-well and P-well base regions 201d, 202d, 203d and 204d, thus, serve as the base for a BJT formed by each emitter region 201a, 202a, 203a and 204a and corresponding collector region 204b, 203b, 201b and 202b, respectively, as indicated by PNP and NPN BJT schematics 201h, 202h, 203h and 204h overlaying the tiles 201-204. Additionally, since the thyristor tile 200 may be part of an overall thyristor device, which further includes a plurality of thyristor tiles (not shown, but each similar to 200), the N-well and P-well base regions 201d, 202d, 203d and 204d may also serve as the base for a BJT formed by each emitter region 201a, 202a, 203a and 204a and another corresponding collector region of another adjacent NPN or PNP tile (similar to 201-204), except for the tiles 201-204 that are at an edge or corner of the overall thyristor device. Therefore, in comparison with the schematic diagram of the thyristor 100 (FIG. 1), the P-type emitter regions 201a and 202a generally correspond to the PNP P-type emitter 103, the N-type base/collector regions 201b/c and 202b/c generally correspond to the N-type base/collector 105/106, the P-type base/collector regions 203*b/c* and 204*b/c* generally correspond to the P-type base/collector 107/108, and the N-type emitter regions 203*a* and 204*a* generally correspond to the NPN N-type emitter 104.

An optional opening or hole 205 is shown at the corners of all four tiles 201-204, where all four tiles 201-204 would otherwise come together at a shared corner point, so that each tile 201-204 (or the N-well and P-well base regions 201*d*, 202*d*, 203*d* and 204*d*) has a generally octagonal shape. The hole 205 may be filled with intrinsic silicon, an N-type low doped silicon, or an insulating material. The hole 205, thus, prevents the PNP tiles 201 and 202 from contacting each other, and prevents the NPN tiles 203 and 204 from contacting each other, so that these components are not shorted out, but are electrically isolated from each other. Additionally, since the thyristor tile 200 may be part of an overall horizontal or lateral thyristor device, which further includes a plurality of thyristor tiles (not shown, but each similar to 200), there is a similar hole at the shared corner point of every possible group of four tiles 201-204, except for the tiles 201-204 that are at an edge or corner of the overall thyristor device, such that there is no additional NPN or PNP tile adjacent thereto.

In some embodiments, the thyristor tile 200 is characterized as having four quadrants, the top left being a first quadrant (having the first PNP tile 201), the top right being a second quadrant (having the first NPN tile 203, and being adjacent to the first quadrant), the bottom right being a third quadrant (having the second PNP tile 202, and being adjacent to the second quadrant and diagonally located from the first quadrant), and the bottom left being a fourth quadrant (having the second NPN tile 204, and being adjacent to the first and third quadrants and diagonally located from the second quadrant). Consequently, since the thyristor tile 200 may be part of an overall horizontal or lateral thyristor device, which further includes a plurality of thyristor tiles (not shown, but each similar to 200), the first PNP tile 201 in the first quadrant of the thyristor tile 200 is located laterally adjacent to the first NPN tile in the second quadrant (or longitudinally adjacent to the second NPN tile in the fourth quadrant) of another thyristor tile, unless the first PNP tile 201 is at an edge or corner of the overall thyristor device. Additionally, the first NPN tile 203 in the second quadrant of the thyristor tile 200 is located laterally adjacent to the first PNP tile in the first quadrant (or longitudinally adjacent to the second PNP tile in the third quadrant) of another thyristor tile, unless the first NPN tile 203 is at an edge or corner of the overall thyristor device. Additionally, the second PNP tile 202 in the third quadrant of the thyristor tile 200 is located laterally adjacent to the second NPN tile in the fourth quadrant (or longitudinally adjacent to the first NPN tile in the second quadrant) of another thyristor tile, unless the second PNP tile 202 is at an edge or corner of the overall thyristor device. Additionally, the second NPN tile 204 in the fourth quadrant of the thyristor tile 200 is located laterally adjacent to the second PNP tile in the third quadrant (or longitudinally adjacent to the first PNP tile in the first quadrant) of another thyristor tile, unless the second NPN tile 204 is at an edge or corner of the overall thyristor device. It is understood, however, that the specific top/bottom and left/right locations for the quadrants and/or the specific relationships between the quadrants are provided for illustrative and explanatory purposes only, since the relative locations for the PNP tiles 201 and 202 can be switched with that of the NPN tiles 203 and 204, and the quadrants can be rotated left or right and/or flipped longitudinally or laterally.

As mentioned above, the example horizontal or lateral thyristor tile 200 may be part of an overall horizontal or lateral thyristor device. In this sense, the terms "horizontal" and "lateral" refer to the plane of the thyristor tile 200 shown in FIG. 2. Therefore, in some embodiments, the thyristor tile 200 is generally characterized as being formed within a horizontal or lateral length or longitudinal dimension (in direction Y) and within a horizontal or lateral width or lateral dimension (in direction X) in the horizontal plane. Additionally, the emitter region 201*a* and the base regions 201*b/c* of the first PNP tile 201 are generally characterized as having (or being aligned in) a first orientation (e.g., in the lateral dimension, direction X); and the emitter region 202*a* and the base regions 202*b/c* of the second PNP tile 202 are also generally characterized as having (or being aligned in) the first orientation. Similarly, the emitter region 203*a* and the base regions 203*b/c* of the first NPN tile 203 are generally characterized as having (or being aligned in) a second orientation (e.g., in the longitudinal dimension, direction Y) that is perpendicular to the first orientation; and the emitter region 204*a* and the base regions 204*b/c* of the second NPN tile 204 are also generally characterized as having (or being aligned in) the second orientation. Furthermore, each N-type base region 201*b* or 202*b* of the PNP tile 201 or 202 is aligned in the first orientation with the N-type emitter region 203*a* or 204*a*, respectively, of the adjacent NPN tile 203 or 204 for which the N-type base region 201*b* or 202*b* is also the N-type collector region; and unless the PNP tile 201 or 202 is at an edge or corner of the overall thyristor device, each N-type base region 201*c* or 202*c* of the PNP tile 201 or 202 is aligned in the first orientation with the N-type emitter region (similar to 203*a* or 204*a*) of an adjacent NPN tile (similar to 203 or 204) for which the N-type base region 201*c* or 202*c* is also the N-type collector region. Similarly, each P-type base region 203*b* or 204*b* of the NPN tile 203 or 204 is aligned in the second orientation with the P-type emitter region 202*a* or 201*a*, respectively, of the adjacent PNP tile 202 or 201 for which the P-type base region 203*b* or 204*b* is also the P-type collector region; and unless the NPN tile 203 or 204 is at an edge or corner of the overall thyristor device, each P-type base region 203*c* or 204*c* of the NPN tile 203 or 204 is aligned in the second orientation with the P-type emitter region (similar to 202*a* or 201*a*) of an adjacent PNP tile (similar to 202 or 201) for which the P-type base region 203*c* or 204*c* is also the P-type collector region.

If a PNP or NPN tile (e.g., 201-204) is at a row/column corner of the overall thyristor device, then that tile has only one collector region and only one of its base regions is used as a collector region for another tile. If a PNP or NPN tile (e.g., 201-204) is at a row or column edge of the overall thyristor device, and if the alignment of the emitter and base regions of the PNP or NPN tile is oriented or aligned parallel with the edge, then that tile has only one collector region, but both of its base regions are used as collector regions for another tile. If a PNP or NPN tile (e.g., 201-204) is at a row or column edge of the overall thyristor device, and if the alignment of the emitter and base regions of the PNP or NPN tile is oriented or aligned perpendicular to the edge, then that tile has two collector regions, but only one of its base regions is used as a collector region for another tile.

Figure 3:
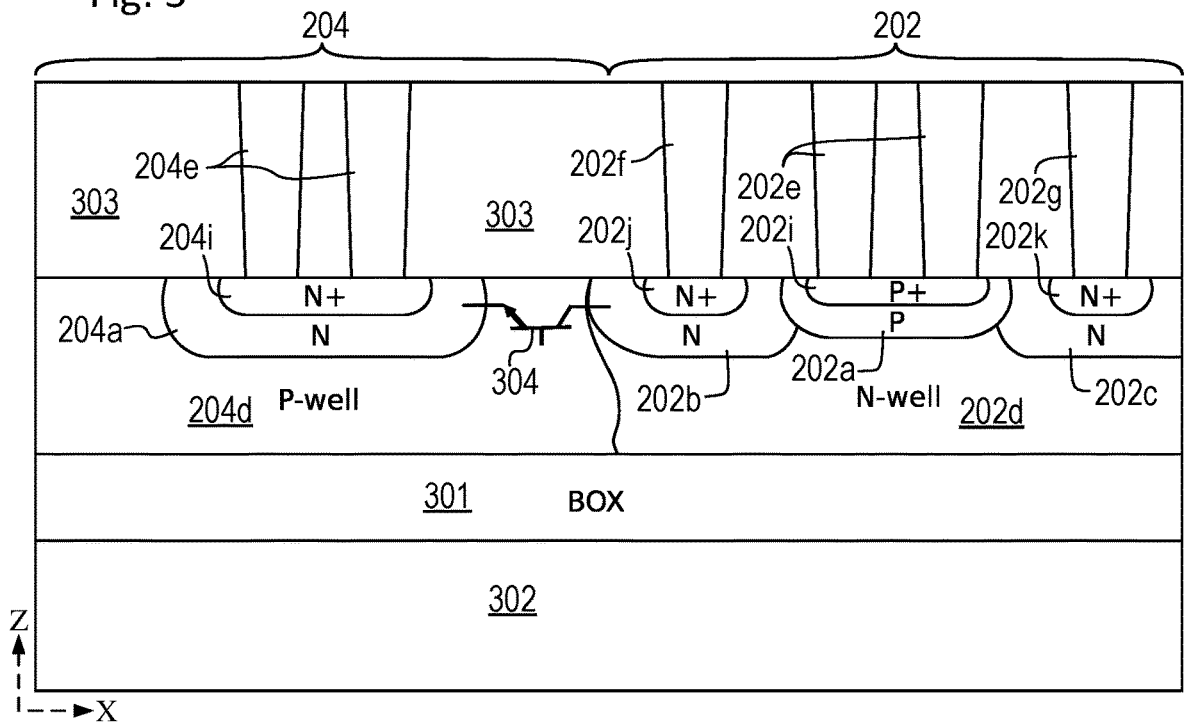
FIGS. 3 and 4 are simplified cross section diagrams of the horizontal or lateral thyristor tile shown in FIG. 2, in accordance with some embodiments.
Figure 4:
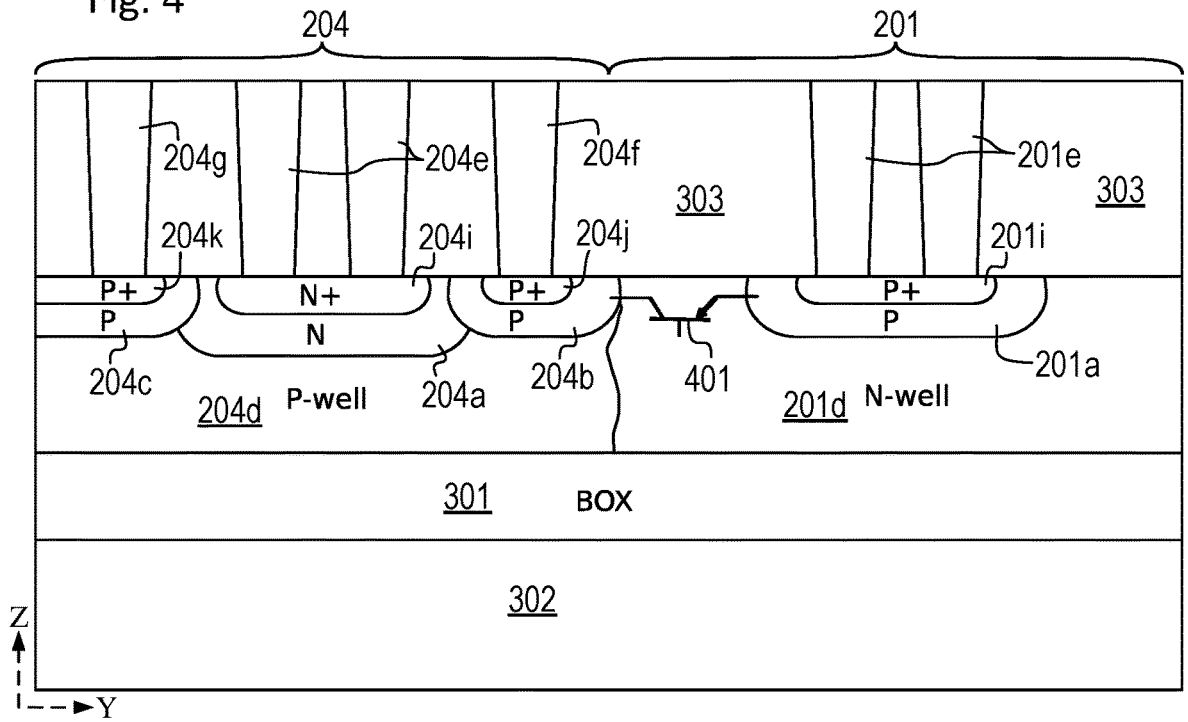

FIGS. 3 and 4 show simplified example cross sections of the thyristor tile 200 taken along section, or cut, lines 206 and 207, respectively, in accordance with some embodiments. FIGS. 3 and 4 further illustrate an example of the layout and structural feature geometry of the thyristor tile 200, and are not necessarily drawn to scale. FIGS. 3 and 4 illustrate that the thyristor tile 200 is generally formed within a vertical thickness (in direction Z), as well as within the aforementioned horizontal or lateral length or longitudinal dimension (in direction Y) and the horizontal or lateral width or lateral dimension (in direction X) in the horizontal plane.

FIG. 3 (cross section through cut line 206) shows an example cross section with the second PNP tile 202 on the right and the second NPN tile 204 on the left. (A similar cross section, not shown, would illustrate the first PNP tile 201 and the first NPN tile 203 in a similar manner using reference numbers with appropriate designations for the tiles 201 and 203.) FIG. 3 shows an active region containing the P-type emitter region 202a, the first and second N-type base/collector regions 202b/c, the N-well base region 202d, the emitter contacts 202e, and the first and second base/collector contacts 202f/g of the second PNP tile 202, and the N-type emitter region 204a, the P-well base region 204d, and the emitter contacts 204e of the second NPN tile 204. The active region also contains a P+ emitter connector region 202i and N+ base/collector (or "base" or "collector") connector regions 202j/k of the second PNP tile 202, and an N+ emitter connector region 204i of the second NPN tile 204. Additionally, a buried oxide (BOX) layer 301 and an underlying substrate 302 are shown for embodiments formed in and on an SOI wafer. The BOX layer 301 is optional, since other embodiments may be formed in and on a bulk semiconductor wafer, i.e., without a buried oxide. Furthermore, a field oxide layer 303 is shown overlying the active region. The first N-type base/collector region 202b, the P-well base region 204d, and the N-type emitter region 204a form a collector, base and emitter, respectively, of an NPN BJT device, as indicated by an NPN BJT schematic 304 overlaying the cross section, but with the base connector outside the plane of this cross section.

FIG. 4 (cross section through cut line 207) shows an example cross section with the first PNP tile 201 on the right and the second NPN tile 204 on the left. (A similar cross section, not shown, would illustrate the second PNP tile 202 and the first NPN tile 203 in a similar manner using reference numbers with appropriate designations for the tiles 202 and 203.) FIG. 4 shows the active region containing the P-type emitter region 201a, the N-well base region 201d, and the emitter contacts 201e of the first PNP tile 201, and the N-type emitter region 204a, the first and second P-type base/collector regions 204b/c, the P-well base region 204d, the emitter contacts 204e, the first and second base/collector contacts 204f/g, and the N+ emitter connector region 204i of the second NPN tile 204. The active region also contains a P+ emitter connector region 201i of the first PNP tile 201, and a P+ base/collector (or "base" or "collector") connector regions 204j/k of the second NPN tile 204. Additionally, the buried oxide (BOX) layer 301 and the underlying substrate 302 are shown for embodiments formed in and on an SOI wafer. Furthermore, the field oxide layer 303 is shown overlying the active region. The first P-type base/collector region 204b, the N-well base region 201d, and the P-type emitter region 201a form a collector, base and emitter, respectively, of a PNP BJT device, as indicated by a PNP BJT schematic 401 overlaying the cross section, but with the base connector outside the plane of this cross section.

To form the structures shown in FIGS. 3 and 4, the N-well base regions 201d and 202d and the P-well base region 204d are epitaxially grown on the buried oxide layer 301 or implanted (e.g., with appropriate N or P type dopants, respectively) into an appropriate semiconductor layer (e.g., an intrinsic silicon layer, an N-minus layer, or a P-minus layer) overlying the buried oxide layer 301. The first and second N-type base/collector regions 202b/c and the N-type emitter region 204a are implanted (e.g., with an appropriate N type dopant) into the N-well base region 202d and the P-well base region 204d, respectively. The first and second N-type base/collector regions 202b/c and the N-type emitter region 204a may generally have a higher net active implant concentration than that of the N-well base regions 201d and 202d. The P-type emitter regions 201a and 202a and the P-type base/collector regions 204b/c are implanted (e.g., with an appropriate P type dopant) into the N-well base regions 201d and 202d and the P-well base region 204d, respectively. The P-type emitter regions 201a and 202a and the P-type base/collector regions 204b/c may generally have a higher net active implant concentration than that of the P-well base region 204d. The N+ base/collector connector regions 202j/k and the N+ emitter connector region 204i (along with other N+ connector regions not shown or labeled in the drawings) are implanted (e.g., with an appropriate N type dopant) into the first and second N-type base/collector regions 202b/c and the N-type emitter region 204a, respectively. The N+ base/collector connector regions 202j/k and the N+ emitter connector region 204i may generally have a higher net active implant concentration than that of the first and second N-type base/collector regions 202b/c and the N-type emitter region 204a. This higher net active implant concentration provides a highly doped ohmic contact between the first and second N-type base/collector regions 202b/c and the first and second base/collector contacts 202f/g, respectively, and between the N-type emitter region 204a and the emitter contacts 204e. The P+ emitter connector regions 201i and 202i and the P+ base/collector connector regions 204j/k (along with other P+ connector regions not shown or labeled in the drawings) are implanted (e.g., with an appropriate P type dopant) into the P-type emitter regions 201a and 202a and the P-type base/collector regions 204b/c, respectively. The P+ emitter connector regions 201i and 202i and the P+ base/collector connector regions 204j/k may generally have a higher net active implant concentration than that of the P-type emitter regions 201a and 202a and the P-type base/collector regions 204b/c. This higher net active implant concentration provides a highly doped ohmic contact between the P-type emitter regions 201a and 202a and the emitter contacts 201e and 202e, respectively, and between the first and second P-type base/collector regions 204b/c and the first and second base/collector contacts 204f/g, respectively. The field oxide layer 303 is deposited over a top surface of the active region. The emitter contacts 201e, 202e and 204e and the base/collector contacts 202f/g and 204f/g are formed through the field oxide layer 303 to electrically contact the P+ emitter connector region 201i, 202i, the N+ emitter connector region 204i, the N+ base/collector connector regions 202j/k, and the P+ base/collector connector regions 204j/k, respectively. Additional electrical interconnect (e.g., metal) layers alternating with insulator layers (e.g., with electrical vias therethrough) are deposited over the contacts 201e, 202e/f/g and 204e/f/g and the field oxide layer 303, as described below with respect to FIGS. 8-11.

FIGS. 2-4 illustrate how the PNP and NPN tiles (or subtiles) 201-204 form the thyristor tile 200 of an overall thyristor device, or a portion thereof. The placement of the emitter regions, base regions and collector regions show how the thyristor device is a horizontal or lateral current flow device. FIGS. 5-7, on the other hand, illustrate how a plurality of the thyristor tile 200 (i.e., a plurality of the PNP tiles 201 and 202 and a plurality of the NPN tiles 203 and 204) can be used to form overall horizontal or lateral thyristor devices, e.g., the thyristor 100 (FIG. 1), in a manner that allows the structure of the thyristor to be scaled in accordance with the available area within the integrated circuit and to provide ESD (electrostatic discharge) protection for the integrated circuit. The high level of flexibility in the design-stage control of device placement, layout, and structural feature geometry allows for little or no need to change the integrated circuit layout to accommodate the resulting thyristor device.

Figure 5:
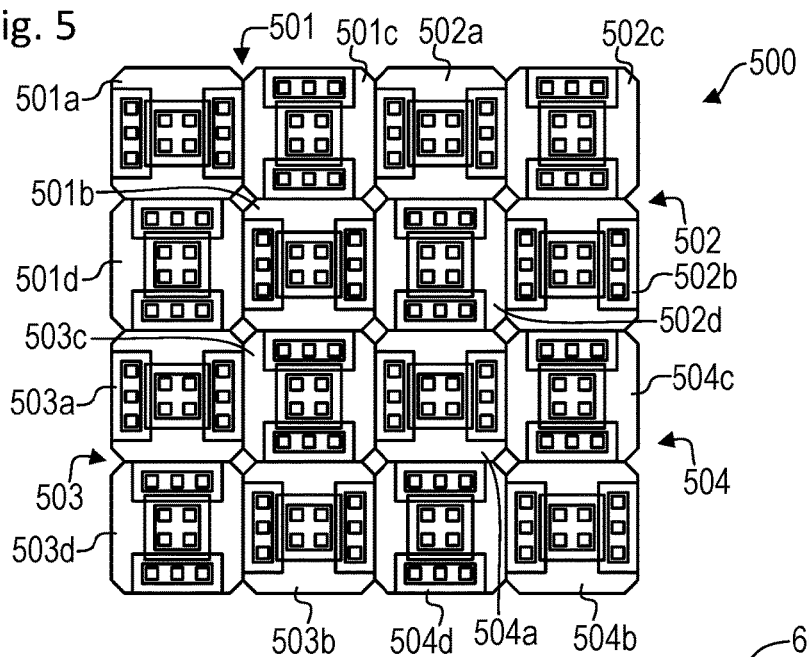
FIGS. 5-7 are simplified diagrams of example horizontal or lateral thyristor devices formed with a plurality of the horizontal or lateral thyristor tile shown in FIGS. 2-4, in accordance with some embodiments.
Figure 6:
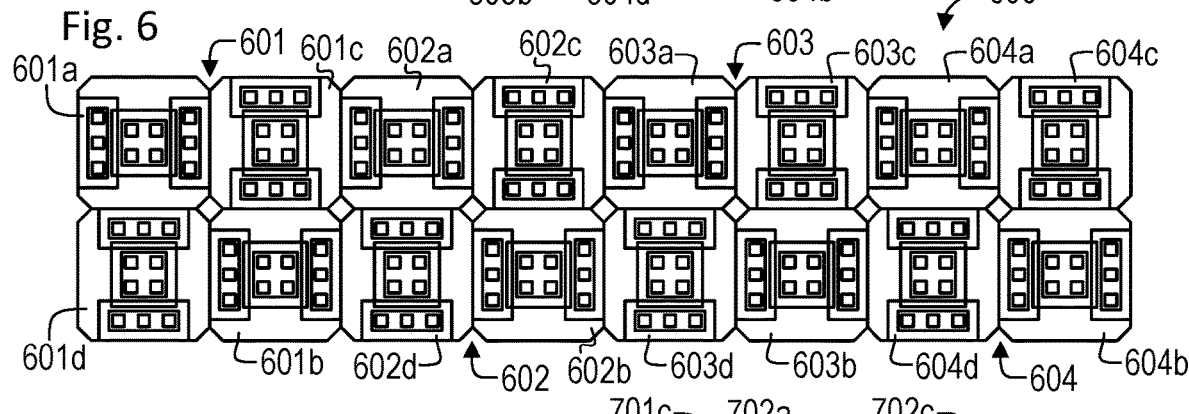
Figure 7:
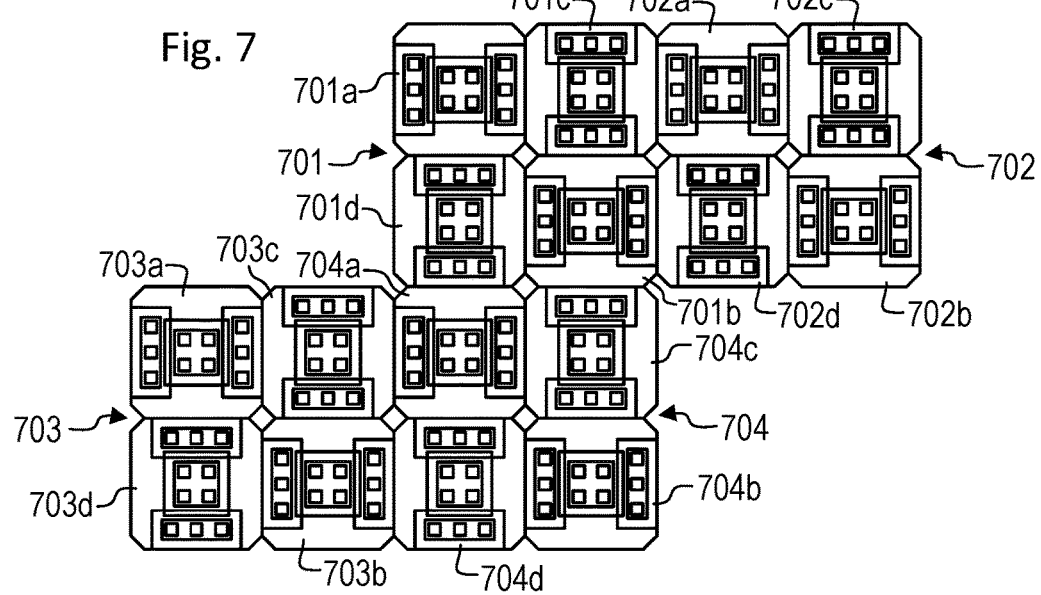
Figure 8:
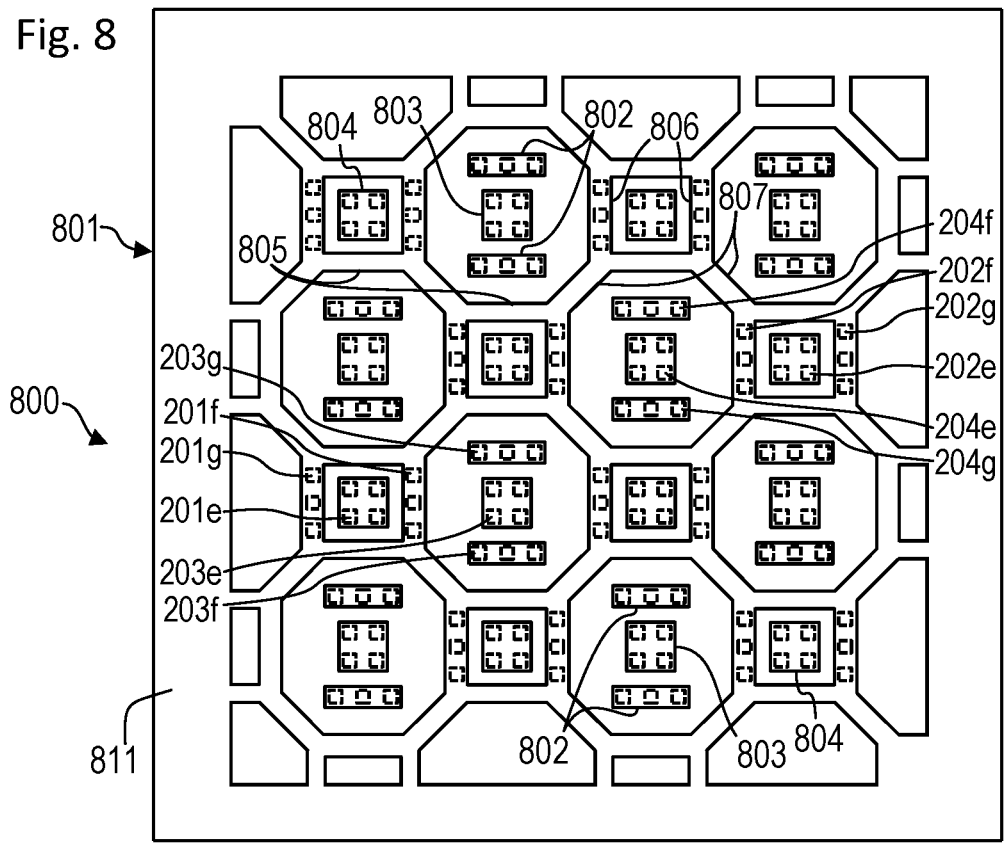
FIGS. 8-11 are simplified diagrams of example interconnect layers and vias for electrically connecting components of an example horizontal or lateral thyristor device formed with a plurality of the horizontal or lateral thyristor tile shown in FIGS. 2-4, in accordance with some embodiments.

The above-described structural feature geometry of the thyristor tile 200 enables a high level of flexibility in design-stage control over device layout for the resulting thyristor device, as illustrated by lateral thyristor devices 500, 600 and 700 in FIGS. 5, 6 and 7, respectively. The lateral thyristor devices 500, 600 and 700 are formed with a plurality of the lateral thyristor tile 200 arranged in a variety of overlapping configurations. The example configurations for the thyristor devices 500, 600 and 700 are shown for illustrative and explanatory purposes only. Other examples may have a variety of other appropriate configurations with other numbers of thyristor tiles that connect or overlap in the manner described herein.

The thyristor device 500 (FIG. 5) includes four thyristor tiles 501-504. Each thyristor tile 501-504 is similar to the thyristor tile 200, so each thyristor tile 501-504 includes two PNP tiles (501a/b, 502a/b, 503a/b and 504a/b) and two NPN tiles (501c/d, 502c/d, 503c/d and 504c/d). Therefore, the thyristor tiles 501-504 are arranged in a 2×2 array or grid of rows and columns, and the PNP and NPN tiles (501a-d, 502a-d, 503a-d and 504a-d) are arranged in an alternating configuration in a 4×4 array or grid of both rows and columns. In other embodiments, additional thyristor tiles 200 could be added to this configuration to make a larger, wider or longer overall thyristor device. Adjacent PNP and NPN tiles (501a-d, 502a-d, 503a-d and 504a-d) share base/collector regions, base/collector connector regions, and base/collector contacts as described above.

The thyristor device 600 (FIG. 6) includes four thyristor tiles 601-604. Each thyristor tile 601-604 is similar to the thyristor tile 200, so each thyristor tile 601-604 includes two PNP tiles (601a/b, 602a/b, 603a/b and 604a/b) and two NPN tiles (601c/d, 602c/d, 603c/d and 604c/d). Therefore, the thyristor tiles 601-604 are arranged in a 1×4 array or grid of rows and columns, and the PNP and NPN tiles (601a-d, 602a-d, 603a-d and 604a-d) are arranged in an alternating configuration in a 2×8 array or grid of both rows and columns. In other embodiments, additional thyristor tiles 200 could be added to this configuration to make a larger, wider or longer overall thyristor device. Adjacent PNP and NPN tiles (601a-d, 602a-d, 603a-d and 604a-d) share base/collector regions, base/collector connector regions, and base/collector contacts as described above.

The thyristor device 700 (FIG. 7) includes four thyristor tiles 701-704. Each thyristor tile 701-704 is similar to the thyristor tile 200, so each thyristor tile 701-704 includes two PNP tiles (701a/b, 702a/b, 703a/b and 704a/b) and two NPN tiles (701c/d, 702c/d, 703c/d and 704c/d). Therefore, the thyristor tiles 701-704 are arranged in a 2×3 array or grid of rows and columns, and the PNP and NPN tiles (701a-d, 702a-d, 703a-d and 704a-d) are arranged in an alternating configuration in a 4×6 array or grid of both rows and columns; however, some of the row/column locations are empty, whereas other row/column locations are occupied. In other embodiments, additional thyristor tiles 200 could be added to this configuration to make a larger, wider or longer overall thyristor device. Adjacent PNP and NPN tiles (701a-d, 702a-d, 703a-d and 704a-d) share base/collector regions, base/collector connector regions, and base/collector contacts as described above.

Variations on the configurations shown in FIGS. 5-7 can be implemented to form the thyristor 100 (FIG. 1) by using almost any available space between other electronic components of an overall electronic circuit of which the thyristor 100 is a part. The use of a plurality of the thyristor tiles 200 thereby enhances the ease of incorporation of the thyristor 100 into the overall electronic circuit. On the other hand, conventional circuit layout techniques for thyristor devices generally require that thyristor tiles or cells be arranged in a rectangular structure to form the thyristor device. In order to fit the rectangular structure into an overall circuit layout, therefore, the footprint of the overall circuit layout might have to be increased to provide sufficient space for the rectangular structure, thereby potentially resulting in having to make revisions to the overall circuit layout. Thus, the ability of the thyristor tiles 200 to be arranged in a variety of multiple complex shapes, as illustrated by the examples in FIGS. 5-7, allows for optimum usage of available space within an existing overall circuit layout, thereby minimizing any potential need to revise the overall circuit layout to fit the resulting thyristor device into the overall circuit layout. The time for and cost of designing the thyristor device and the overall circuit are thus reduced.

FIGS. 8-11 show simplified diagrams of novel example interconnect layers (e.g., electrical interconnect or metal layers 800, 900, 1000 and 1100) and the underlying contacts or vias for electrically connecting components of an example horizontal or lateral thyristor device formed with a plurality of the thyristor tile 200 shown in FIGS. 2-4, in accordance with some embodiments. Each interconnect layer 800, 900, 1000 and 1100 corresponds to and forms a terminal of the thyristor device, e.g., the interconnect layer 800 corresponds to the N-type base/collector 105/106, the interconnect layer 900 corresponds to the P-type base/collector 107/108, the interconnect layer 1000 corresponds to the NPN N-type emitter 104, and the interconnect layer 1100 corresponds to the PNP P-type emitter 103, of the thyristor 100 shown in FIG. 1. Each interconnect layer 800, 900, 1000 and 1100, thus, connects to the corresponding components of each underlying thyristor tile 200 in parallel.

The example layouts of the interconnect layers 800, 900, 1000 and 1100 are provided for an overall thyristor device similar to the lateral thyristor device 500 (FIG. 5), i.e., with the thyristor tiles 501-504 arranged in a 2×2 array or grid of rows and columns, and the PNP and NPN tiles (501a-d, 502a-d, 503a-d and 504a-d) arranged in an alternating configuration in a 4×4 array or grid of both rows and columns. Similarly designed interconnect layer layouts can be provided for any other appropriate configuration for any other overall thyristor device, e.g., including the lateral thyristor devices 600 and 700 of FIGS. 6 and 7, among others.

The proper timing and distribution of electrical signals or currents provided to the emitter, base and collector connectors of the PNP and NPN tiles (e.g., 201-204 or 501a-504d) is essential for the PNP and NPN tiles to operate in accord with each other, thereby ensuring proper functioning of the overall thyristor device (e.g., 500, 600 and 700). The complex and novel example layouts or geometry of the interconnect layers 800, 900, 1000 and 1100, therefore, ensure uniformity in the connections to the contacts 201e/f/g, 202e/f/g, 203e/f/g and 204e/f/g of the underlying thyristor tiles 200, so that the electrical signals or currents are properly and evenly distributed thereto, thereby enabling the usage of the unique structure of the thyristor tiles 200 and the manufacturability and scalability of the lateral thyristor devices (e.g., 500, 600 and 700). The interconnect layers 800, 900, 1000 and 1100 generally connect the contacts or terminals in a manner that ensures that current distribution through the various contacts, vias and interconnects is approximately equal and avoids current crowding throughout the structure of the lateral thyristor devices (e.g., 500, 600 and 700).

The example interconnect layer 800 (FIG. 8) generally includes a conductor trace 801 and a plurality of island traces 802, 803 and 804. The conductor trace 801 and the island traces 802-804 may be any appropriate conductive material, such as copper, aluminum, another metal, or a non-metal electrical conductor, depending on the operational or design requirements or needs of the overall thyristor device or the overall electronic circuit and/or the availability or cost of materials. The example interconnect layer 800 is formed or deposited on top of the contacts 201$e/f/g$, 202$e/f/g$, 203$e/f/g$ and 204$e/f/g$ and the field oxide layer 303 and with insulation material between each of the traces 801-804.

The conductor trace 801 electrically connects to the base/collector contacts (e.g., 201$f/g$ and 202$f/g$) and, thus, to the N-type base regions (e.g., 201$b/c$ and 202$b/c$) of the PNP tiles (e.g., 201 and 202) of the thyristor tiles (e.g., 200) of the overall thyristor device 500. The island traces 802 electrically connect to the base/collector contacts (e.g., 203$f/g$ and 204$f/g$) of the NPN tiles (e.g., 203 and 204). The island traces 803 electrically connect to the emitter contacts (e.g., 203$e$ and 204$e$) of the NPN tiles (e.g., 203 and 204). The island traces 804 electrically connect to the emitter contacts (e.g., 201$e$ and 202$e$) of the PNP tiles (e.g., 201 and 202). The contacts 201$e/f/g$, 202$e/f/g$, 203$e/f/g$ and 204$e/f/g$ are shown in dashed lines to signify that they are disposed under the example interconnect layer 800. Further electrical interconnections from the conductor trace 801 to other electronic components of the overall electronic circuit or to external connection pads thereof are made from extensions at the periphery (e.g. a peripheral trace 811) of the conductor trace 801 through other conductor traces, vias and interconnect layers.

The structure of the conductor trace 801 generally includes traces, or trace portions, such as lateral traces 805, longitudinal traces 806, and diagonal traces 807. The longitudinal traces 806 provide the electrical contacts or connections between the conductor trace 801 and the base/collector contacts (e.g., 201$f/g$ and 202$f/g$) and, thus, to the N-type base regions (e.g., 201$b/c$ and 202$b/c$). The lateral traces 805 and the longitudinal traces 806 connect at their endpoints to form generally rectangular structures that surround the island traces 804. The lateral traces 805, the longitudinal traces 806, and the diagonal traces 807 connect at their endpoints to form generally octagonal structures that surround the island traces 802 and 803. Thus, the diagonal traces 807 connect at their endpoints to vertices of the generally rectangular structures formed by the lateral traces 805 and the longitudinal traces 806. The horizontal thicknesses of the lateral traces 805, the longitudinal traces 806, the diagonal traces 807, and the island traces 802-804 are generally selected or designed to allow for appropriate clear distances between the traces 805-807 of the conductor trace 801 and the island traces 802-804, depending on acceptable interconnect or metallization design rules and the operational or design requirements or needs of the overall thyristor device or the overall electronic circuit.

The example interconnect layer 900 (FIG. 9) generally includes a conductor trace 902 and a plurality of island traces 903 and 904. The conductor trace 902 and the island traces 903 and 904 may be any appropriate conductive material, such as copper, aluminum, another metal, or a non-metal electrical conductor, depending on the operational or design requirements or needs of the overall thyristor device or the overall electronic circuit and/or the availability or cost of materials. The example interconnect layer 900 is formed or deposited on top of an insulator layer (deposited on top of the interconnect layer 800) with electrical vias (described below) therethrough and with insulation material between each of the traces 902-904.

The conductor trace 902 electrically connects to base/collector vias 905 that electrically connect to the island traces 802 (FIG. 8) and to the base/collector contacts (e.g., 203$f/g$ and 204$f/g$) of the NPN tiles (e.g., 203 and 204) of the thyristor tiles (e.g., 200) of the overall thyristor device 500. The island traces 903 electrically connect to emitter vias 906 that electrically connect to the island traces 803 (FIG. 8) and to the emitter contacts (e.g., 203$e$ and 204$e$) of the NPN tiles (e.g., 203 and 204). The island traces 904 electrically connect to emitter vias 907 that electrically connect to the island traces 804 (FIG. 8) and to the emitter contacts (e.g., 201$e$ and 202$e$) of the PNP tiles (e.g., 201 and 202). The vias 905, 906 and 907 are shown in dashed lines to signify that they are disposed under the example interconnect layer 900, e.g., within and through the underlying insulator layer. Further electrical interconnections from the conductor trace 902 to other electronic components of the overall electronic circuit or to external connection pads thereof are made from extensions at the periphery (e.g. a peripheral trace 911) of the conductor trace 902 through other conductor traces, vias and interconnect layers.

The structure of the conductor trace 902 generally includes traces, or trace portions, such as lateral traces 908, longitudinal traces 909, and diagonal traces 910. The lateral traces 908 provide the electrical contacts or connections between the conductor trace 902 and the base/collector vias 905 and, thus, to the island traces 802, the base/collector contacts (e.g., 203$f/g$ and 204$f/g$), and the P-type base regions (e.g., 203$b/c$ and 204$b/c$). The lateral traces 908 and the longitudinal traces 909 connect at their endpoints to form generally rectangular structures that surround the island traces 903. The lateral traces 908, the longitudinal traces 909, and the diagonal traces 910 connect at their endpoints to form generally octagonal structures that surround the island traces 904. Thus, the diagonal traces 910 connect at their endpoints to vertices of the generally rectangular structures formed by the lateral traces 908 and the longitudinal traces 909. The conductor trace 902, therefore, has a generally similar configuration or geometry as that of the conductor trace 801 (FIG. 8), but the rectangular and octagonal structures of the conductor trace 902 are shifted or offset relative to the similar structures of the conductor trace 801, such that the octagonal structures of the conductor trace 902 are vertically aligned with the rectangular structures of the conductor trace 801, and the rectangular structures of the conductor trace 902 are vertically aligned with the octagonal structures of the conductor trace 801. The horizontal thicknesses of the lateral traces 908, the longitudinal traces 909, the diagonal traces 910, and the island traces 903 and 904 are generally selected or designed to allow for appropriate clear distances between the traces 908-910 of the conductor trace 902 and the island traces 903 and 904, depending on acceptable interconnect or metallization design rules and the operational or design requirements or needs of the overall thyristor device or the overall electronic circuit. For example, in this embodiment, a set of only two vias are shown for each group of the emitter vias 906 and 907 (as opposed to the set of four contacts, as was shown for each group of the contacts 201e, 202e, 203e and 204e in FIG. 8), and the island traces 903 and 904 are shown as small rectangles (smaller than the squares shown for the island traces 803 and 804), in order to pass acceptable interconnect or metallization design rule checks, and so that the overall thyristor device has optimum performance characteristics.

Although the first example interconnect layer 800 and the second example interconnect layer 900 are shown and described for electrically connecting (directly or indirectly) to the PNP base/collector contacts 201f/g and 202f/g and the NPN base/collector contacts 203f/g and 204f/g, respectively, it is understood that these electrical connections may be reversed. In other words, in other embodiments, the NPN base/collector contacts 203f/g and 204f/g could be electrically connected through the first interconnect layer, and the PNP base/collector contacts 201f/g and 202f/g could be electrically connected through the second interconnect layer.

The example interconnect layer 1000 (FIG. 10) generally includes a conductor trace 1003 and a plurality of island traces 1004. The conductor trace 1003 and the island traces 1004 may be any appropriate conductive material, such as copper, aluminum, another metal, or a non-metal electrical conductor, depending on the operational or design requirements or needs of the overall thyristor device or the overall electronic circuit and/or the availability or cost of materials. The example interconnect layer 1000 is formed or deposited on top of an insulator layer (deposited on top of the interconnect layer 900) with electrical vias (described below) therethrough and with insulation material between each of the traces 1003 and 1004.

The conductor trace 1003 electrically connects to emitter vias 1006 that electrically connect to the island traces 903 (FIG. 9) and through to the emitter vias 906, the island traces 803 (FIG. 8), and the emitter contacts (e.g., 203e and 204e) of the NPN tiles (e.g., 203 and 204) of the thyristor tiles (e.g., 200) of the overall thyristor device 500. The island traces 1004 electrically connect to emitter vias 1007 that electrically connect to the island traces 904 and through to the emitter vias 907, the island traces 804 (FIG. 8), and the emitter contacts (e.g., 201e and 202e) of the PNP tiles (e.g., 201 and 202). The vias 1006 and 1007 are shown in dashed lines to signify that they are disposed under the example interconnect layer 1000, e.g., within and through the underlying insulator layer. Further electrical interconnections from the conductor trace 1003 to other electronic components of the overall electronic circuit or to external connection pads thereof are made from extensions at the periphery (e.g. lateral peripheral traces 1008 and longitudinal peripheral traces 1009) of the conductor trace 1003 through other conductor traces, vias and interconnect layers.

The structure of the conductor trace 1003 generally includes traces, or trace portions, such as first and second sets of diagonal traces 1010 and 1011. Each diagonal trace 1010 extends along or parallel to a first diagonal direction (e.g., at about a negative 45-degree angle relative to lateral peripheral traces 1008 and longitudinal peripheral traces 1009 or between top left and bottom right). Each diagonal trace 1011 extends along or parallel to a second diagonal direction (e.g., at about a positive 45-degree angle relative to the lateral peripheral traces 1008 and the longitudinal peripheral traces 1009 or between top right and bottom left). In some embodiments, the diagonal traces 1010 and 1011 are perpendicular to each other. The diagonal traces 1010 and 1011 generally form rhombus shapes, diamond shapes, or 45-degree-rotated rectangle or square shapes that surround the island traces 1004. Each diagonal trace 1010 and 1011 electrically connects (e.g., through the emitter vias 1006, the island traces 903, the emitter vias 906, the island traces 803, and the emitter contacts 203e and 204e) to the N-type emitter regions (e.g., 203a and 204a) of the NPN tiles (e.g., 203 and 204) that are aligned along the same diagonal directions. The horizontal thicknesses of the diagonal traces 1010 and 1011 and the island traces 1004 are generally selected or designed to allow for appropriate clear distances between the diagonal traces 1010 and 1011 of the conductor trace 1003 and the island traces 1004, depending on acceptable interconnect or metallization design rules and the operational or design requirements or needs of the overall thyristor device or the overall electronic circuit.

The example interconnect layer 1100 (FIG. 11) generally includes a conductor trace 1104. The conductor trace 1104 may be any appropriate conductive material, such as copper, aluminum, another metal, or a non-metal electrical conductor, depending on the operational or design requirements or needs of the overall thyristor device or the overall electronic circuit and/or the availability or cost of materials. The example interconnect layer 1100 is formed or deposited on top of an insulator layer (deposited on top of the interconnect layer 1000) with electrical vias (described below) therethrough.

The conductor trace 1104 electrically connects to emitter vias 1107 that electrically connect to the island traces 1004 (FIG. 10) and through to the emitter vias 1007, the island traces 904 (FIG. 9), the emitter vias 907, the island traces 804 (FIG. 8), and the emitter contacts (e.g., 201e and 202e) of the PNP tiles (e.g., 201 and 202) of the thyristor tiles (e.g., 200) of the overall thyristor device 500. The emitter vias 1107 are shown in dashed lines to signify that they are disposed under the example interconnect layer 1100, e.g., within and through the underlying insulator layer. Further electrical interconnections from the conductor trace 1104 to other electronic components of the overall electronic circuit or to external connection pads thereof are made from extensions at the periphery of the conductor trace 1104 through other conductor traces, vias and interconnect layers.

The structure of the conductor trace 1104 is generally that of a flat plate or sheet with periodically spaced holes or slots 1108. The holes 1108 are generally rectangular or square shaped. The holes 1108 prevent or mitigate warpage or deformation of the conductor trace 1104 (and potential damage to adjacent underlying or overlying material layers) when the conductor trace 1104 becomes hot during operation of the thyristor device and the overall electronic circuit. Acceptable interconnect or metallization design rules typically require such holes to be spaced from via connections. Dotted-line squares 1109 are shown to represent such a required spacing distance around the emitter vias 1107, so that the emitter vias 1107 are overlaid by a sufficient amount of the material of the interconnect layer 1100. The holes 1108, therefore, are shown outside the dotted-line squares 1109. As a result, the holes 1108 are horizontally offset from the center of the underlying thyristor tiles (e.g., 200). Alternatively, in some embodiments, the conductor trace 1104 of the fourth interconnect layer 1100 could have a generally similar configuration or geometry as that of the conductor trace 1003 (FIG. 10) of the third interconnect layer 1000, but with the diagonal traces 1010 and 1011 shifted or offset relative to the similar structures of the conductor trace 1003, such that the intersections of the diagonal traces 1010 and 1011 are vertically aligned with the emitter vias 1107.

Although the third example interconnect layer 1000 and the fourth example interconnect layer 1100 are shown and described for electrically connecting through to the NPN emitter contacts 203e and 204e and the PNP emitter contacts 201e and 202e, respectively, it is understood that these electrical connections may be reversed. In other words, in other embodiments, the PNP emitter contacts 201e and 202e could be electrically connected through the third interconnect layer, and the NPN emitter contacts 203e and 204e could be electrically connected through the fourth interconnect layer.

Additionally, each of the electrical interconnect or metal layers 800, 900, 1000 and 1100 has an outer edge or peripheral trace (e.g., 811, 911, 1008/1009) that fully encompasses the entire electrical interconnect or metal layers 800, 900, 1000 and 1100. In other words, each of the electrical interconnect or metal layers 800, 900, 1000 and 1100 is exposed on all four sides. In other words, the electrical interconnect or metal layers 800, 900, 1000 and 1100 are each configured to receive an electrical connection thereto at any point along any peripheral side thereof. Consequently, the electrical interconnections (from the electrical interconnect or metal layers 800, 900, 1000 and 1100 to other electronic components of the overall electronic circuit or to external connection pads thereof) can be made on any one or more (or all four) sides of the electrical interconnect or metal layers 800, 900, 1000 and 1100. This feature enables the advantage of allowing easy electrical connection to the thyristor device 100 and placement of the thyristor device 100 at almost any available location within the overall electronic circuit or integrated circuit. In contrast, many prior art thyristor designs require electrical connections to be on a particular side of the thyristor; thereby restricting the potential for placing the thyristor within an overall integrated circuit.

FIGS. 12-18 and 20-26 show simplified graphs indicating the performance of example improved horizontal or lateral thyristor devices formed with a plurality of horizontal or lateral thyristor tiles (e.g., similar to the thyristor tile 200 shown in FIGS. 2-4), in accordance with some embodiments. The data available in these graphs illustrate that the example improved horizontal or lateral thyristor devices perform or function as well as, or better than, a conventional thyristor device.

Figure 12:
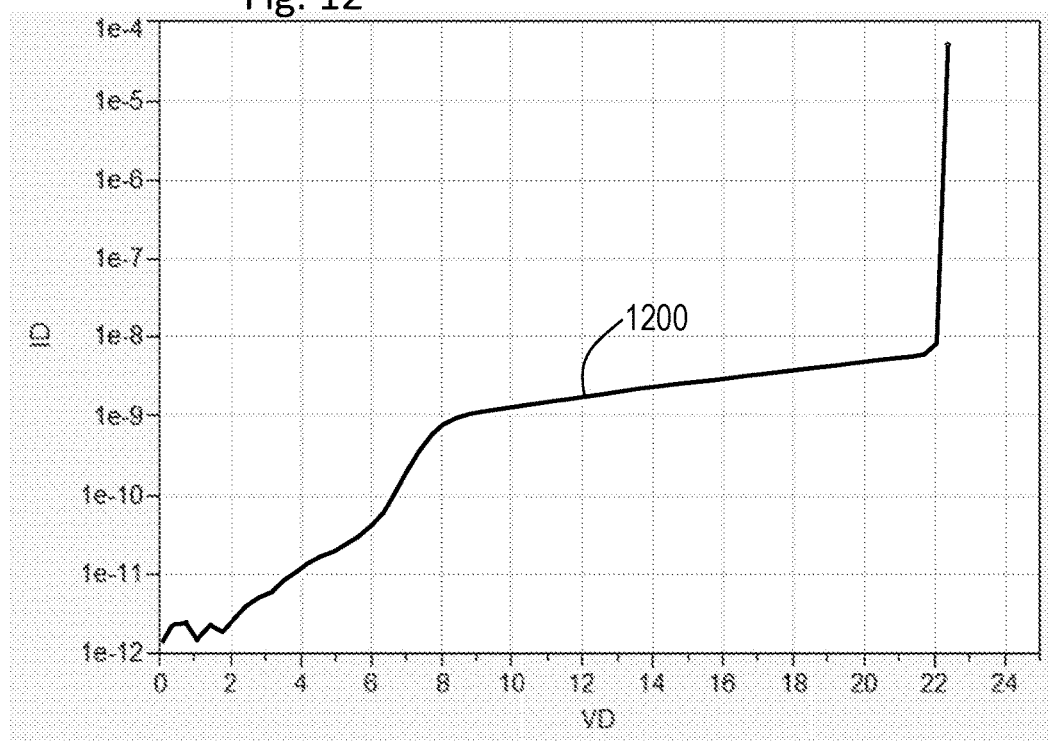
FIGS. 12-15 are simplified current-voltage graphs showing the performance of an example horizontal or lateral thyristor device formed with a plurality of the horizontal or lateral thyristor tile shown in FIGS. 2-4, in accordance with some embodiments.
Figure 13:
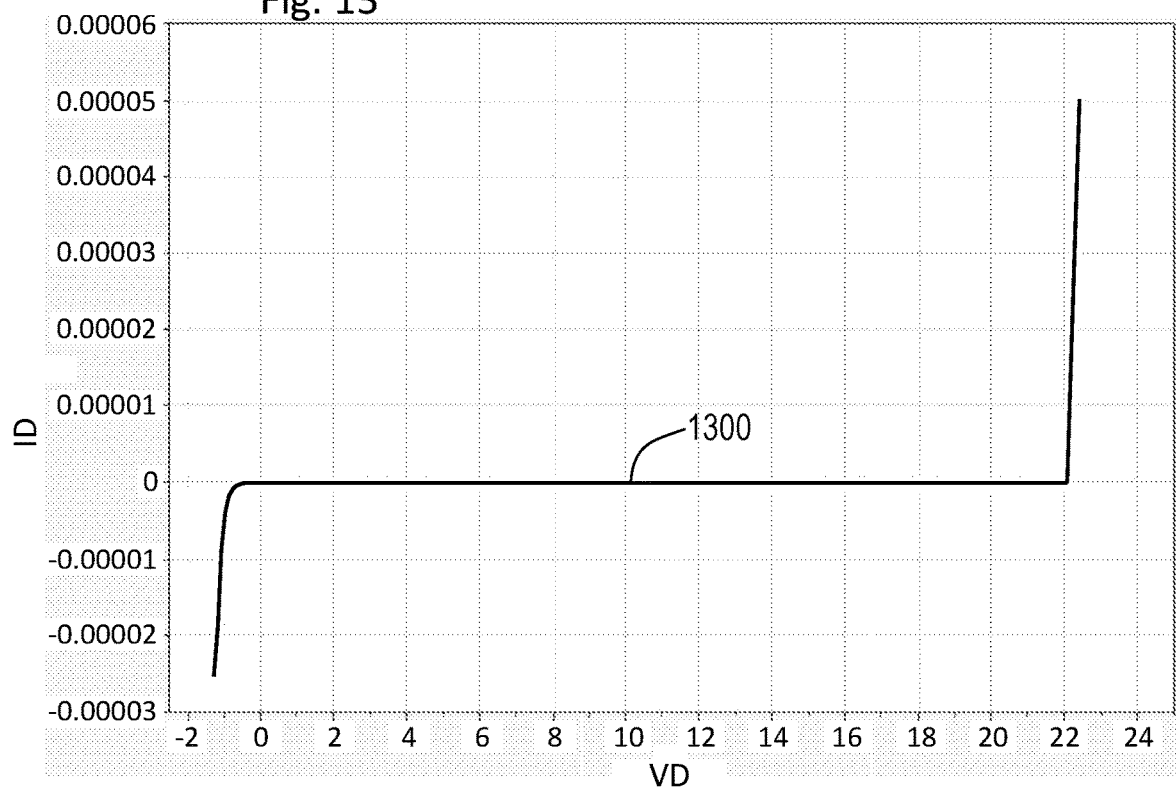
Figure 14:
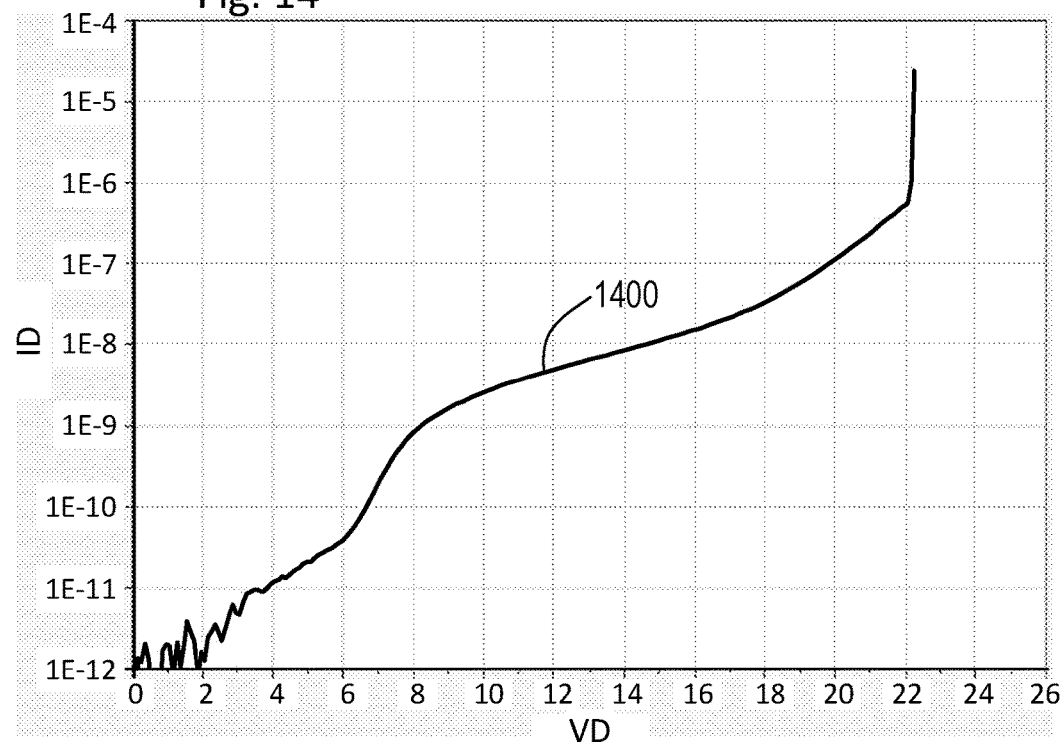
Figure 15:
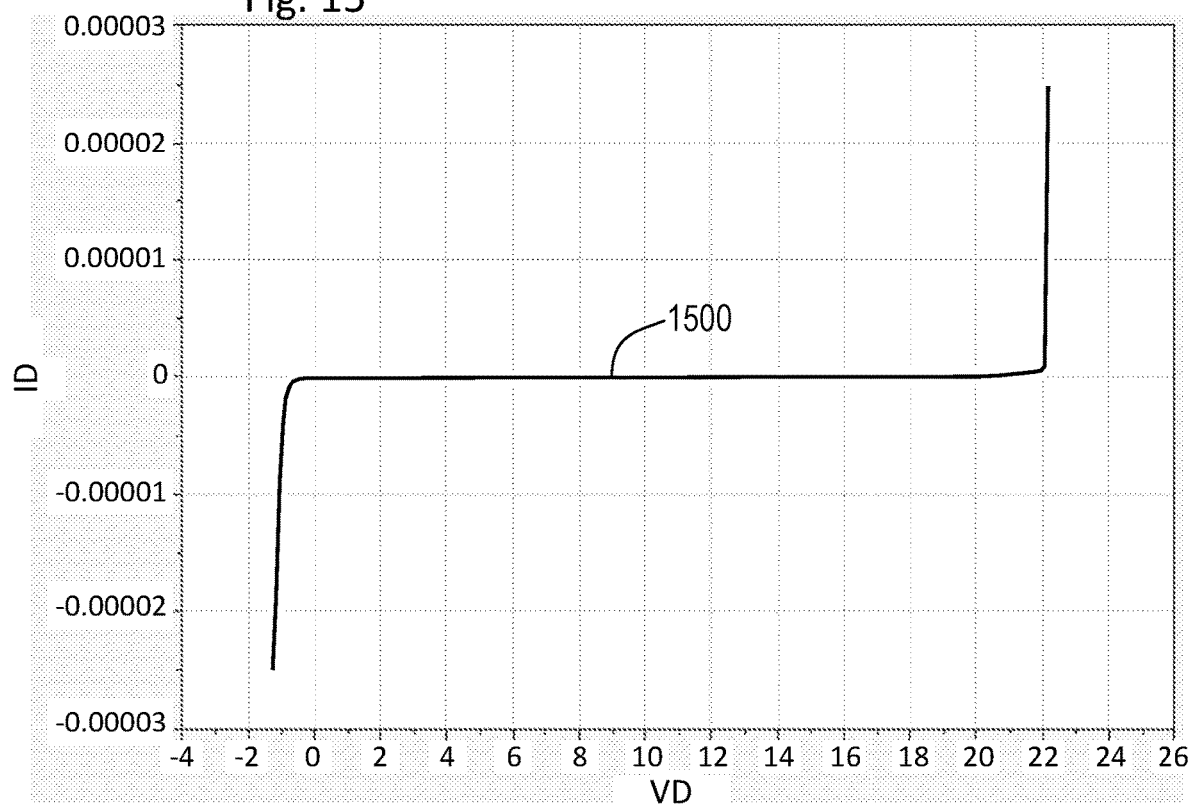

FIGS. 12 and 13 show simplified graphs 1200 and 1300 of reverse diode breakdown current (ID) versus voltage (VD) curves (I-V curves), and FIGS. 14 and 15 show simplified graphs 1400 and 1500 of SCR breakdown I-V curves, for an example thyristor device. The example thyristor device in these tests incorporates a 4×4 array or grid of thyristor tiles (e.g., each similar to the thyristor tile 200). In the reverse diode configuration for the graphs 1200 and 1300, a bias voltage is applied to the N-type base/collector (e.g., 105 and 106 of FIG. 1, and 201b/c and 202b/c of FIG. 2), a ground is applied to the P-type base/collector (e.g., 107 and 108 of FIG. 1, and 203b/c and 204b/c of FIG. 2), and the PNP and NPN emitters (e.g., 103 and 104 of FIG. 1, and 201a, 202a, 203a and 204a of FIG. 2) are floating. In the SCR configuration for the graphs 1400 and 1500, a bias voltage is applied to the PNP emitter (e.g., 103 of FIG. 1, and 201a and 202a of FIG. 2) and the N-type base/collector (e.g., 105 and 106 of FIG. 1, and 201b/c and 202b/c of FIG. 2), and a ground is applied to the NPN emitter (e.g., 104 of FIG. 1, and 203a and 204a of FIG. 2) and the P-type base/collector (e.g., 107 and 108 of FIG. 1, and 203b/c and 204b/c of FIG. 2).

The I-V curves 1300 and 1500 are provided with a linear scale for both the current and voltage, which, therefore, also allows for presentation of negative current and voltage values. The I-V curves 1200 and 1400 are provided with a logarithmic scale for the current (ID) and a linear scale for the voltage (VD), thereby showing enhanced details in the low voltage range. These tests were performed with direct current (DC) I-V sweeps from less than −1.0 volts to greater than 22 volts. All of the graphs show that the example thyristor device provided excellent voltage blocking capabilities up to about 22 volts. Additionally, the I-V curves 1200 and 1400 indicate that the thyristor device exhibited slightly more leakage current in the SCR configuration than in the reverse diode configuration.

FIGS. 16-18 show simplified current-voltage (I-V) and leakage current graphs 1601, 1602, 1701, 1702, 1801 and 1802 for the results of transmission line pulse (TLP) tests for three example horizontal or lateral thyristor devices (e.g., tiled SCR devices) formed with a plurality of horizontal or lateral thyristor tile (e.g., each similar to the thyristor tile 200 shown in FIGS. 2-4), in accordance with some embodiments. The first example thyristor, or tiled SCR, device used for the tests for graphs 1601 and 1602 included a 4×4 array or grid of the thyristor tiles (e.g., each similar to the thyristor tile 200) and had horizontal length/width dimensions, or footprint, of about 33 μm by 33 μm. The second example thyristor, or tiled SCR, device used for the tests for graphs 1701 and 1702 included a 5×5 array or grid of the thyristor tiles (e.g., each similar to the thyristor tile 200) and had horizontal length/width dimensions of about 41 μm by 41 μm. The third example thyristor, or tiled SCR, device used for the tests for graphs 1801 and 1802 included a 6×6 array or grid of the thyristor tiles (e.g., each similar to the thyristor tile 200) and had horizontal length/width dimensions of about 49 μm by 49 μm.

To generate each of the graphs 1601, 1602, 1701, 1702, 1801 and 1802, a trigger voltage of about one volt was used, as indicated by a vertical dashed line 1803. The graphs 1602, 1702 and 1802 show the current-voltage characteristics (bottom horizontal axis) of the three example thyristors. The graphs 1601, 1701 and 1801 show the leakage current (top horizontal axis on a logarithmic scale) for the three example thyristors. The leakage current for each example thyristor is shown as approximately 1E-11 Amps, as indicated by the vertical portion of the graphs 1601, 1701 and 1801. The point at which the graphs 1601, 1701 and 1801 turn almost horizontal represents the point at which the example thyristor becomes damaged, i.e., the leakage current increases significantly. For the third (6×6) example thyristor, for example, the current at which the thyristor became damaged was about 7.8 Amps (indicated by horizontal dashed line 1804), which is a relatively large current for this type of device. The maximum current density (Jmax) at this point can then be calculated based on the above mentioned dimensions of the third example thyristor. Similar calculations can be made for the first and second example thyristors.

With the data shown by the graphs 1601, 1602, 1701, 1702, 1801 and 1802 and the above mentioned dimensions, it is shown or calculated that the example thyristor devices exhibited maximum current density (Jmax) capabilities of more than 3 mA/μm$^2$, which is very robust for SOI technology. For example, the Jmax for the first example thyristor device is about 3.021 mA/μm$^2$, the Jmax for the second example thyristor device is about 3.107 mA/μm², and the Jmax for the third example thyristor device is about 3.310 mA/μm². The maximum current density results for the larger example thyristor devices are slightly higher than those for the smaller example thyristor devices, which is the opposite of the proportionality relationship for conventional thyristor devices (wherein larger conventional thyristor devices typically exhibit smaller maximum current densities due to current crowding effects, particularly in SCR configurations). In other words, the robustness of the structure was slightly greater for the larger structures. Additionally, the example thyristors exhibited relatively uniform current capabilities, which is highly significant for ESD protection for an SOI-based device. The direct proportionality relationship between the size of the example thyristor devices and the maximum current density is, thus, an unexpected result. Additionally, with this data and information, it is further shown or calculated that the example thyristor devices exhibited relatively low on resistance (Ron) for the given footprint dimensions, or device sizes. For example, the Ron for the first example thyristor device is about 1.445Ω, the Ron for the second example thyristor device is about 0.975Ω, and the Ron for the third example thyristor device is about 0.616Ω. It is thus shown that thyristor devices formed with a plurality of the thyristor tiles 200 have excellent, and in some cases better than expected, performance characteristics.

Figure 19:
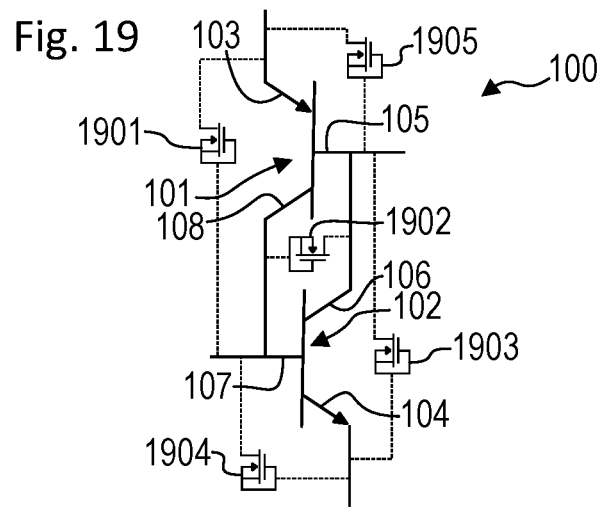
FIG. 19 is a simplified schematic diagram of a thyristor with optional triggers.
Figure 20:
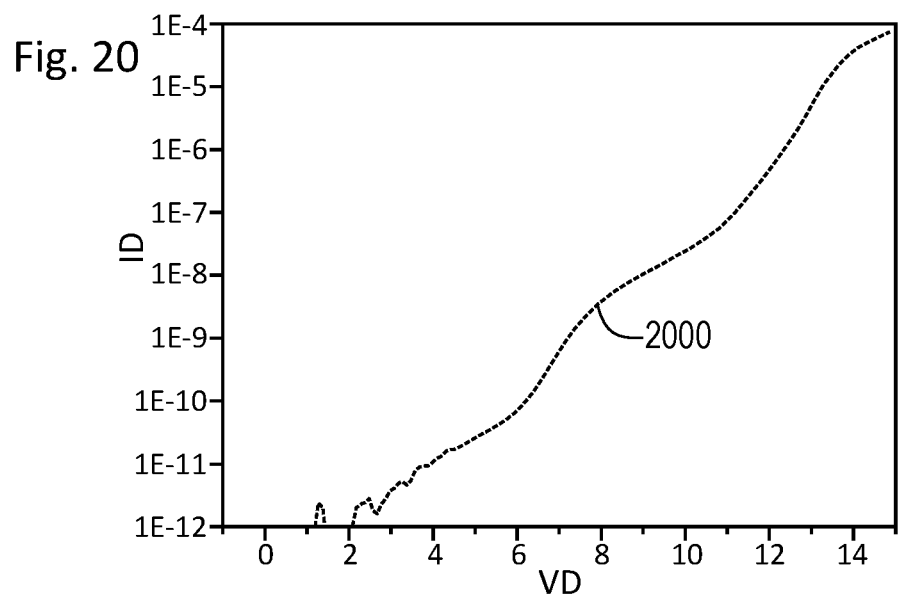
FIGS. 20-26 are simplified current-voltage graphs showing the performance of an example horizontal or lateral thyristor device formed with a plurality of the horizontal or lateral thyristor tile shown in FIGS. 2-4, in accordance with some embodiments.
Figure 21:
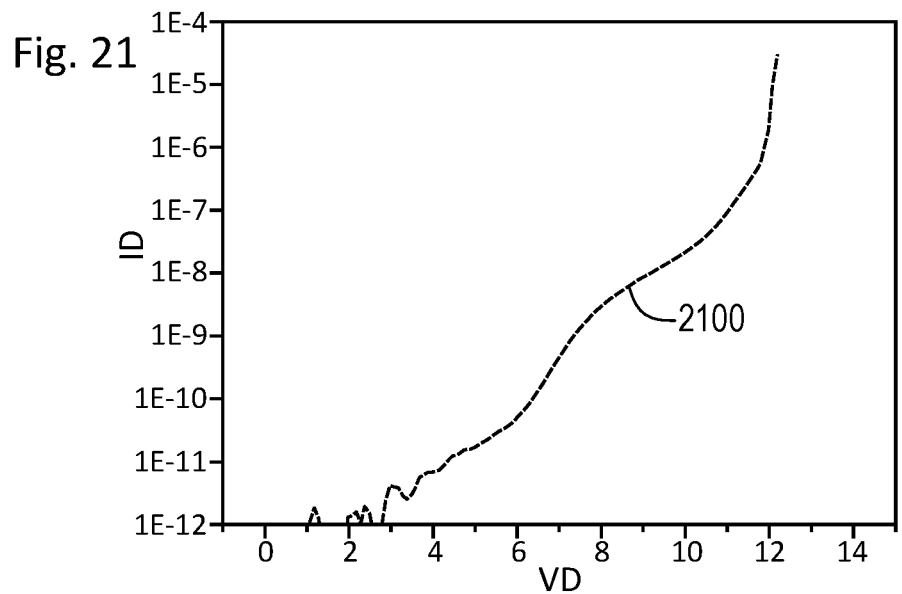
Figure 22:
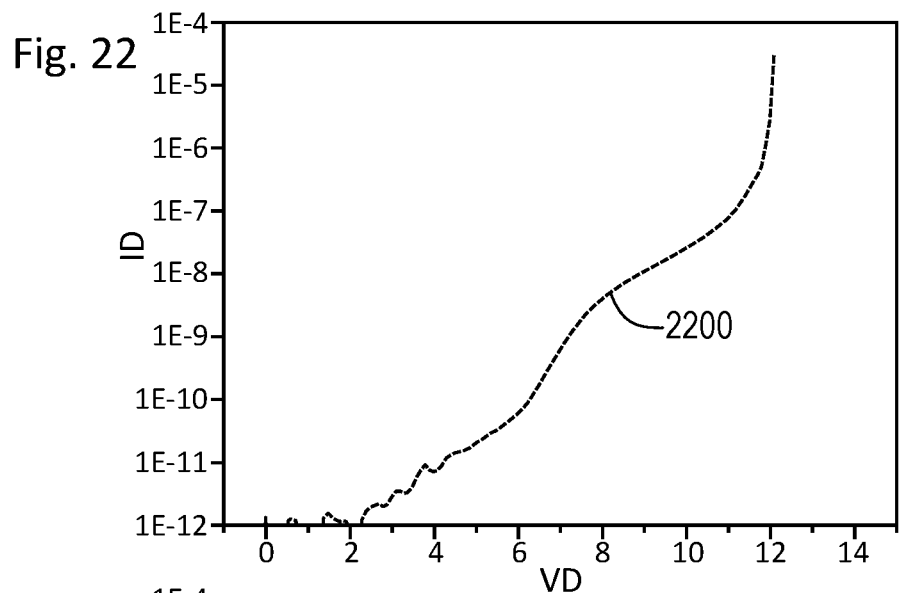
Figure 23:
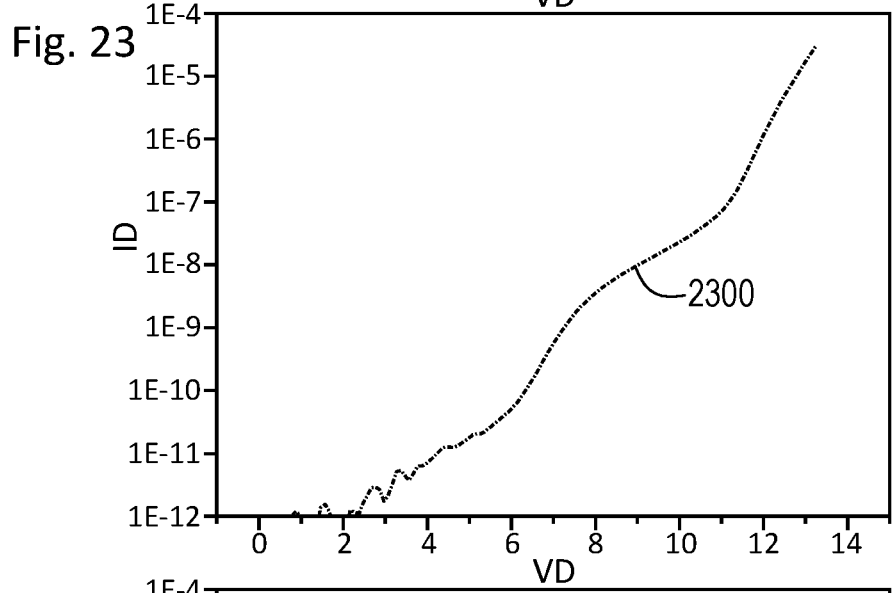
Figure 24:
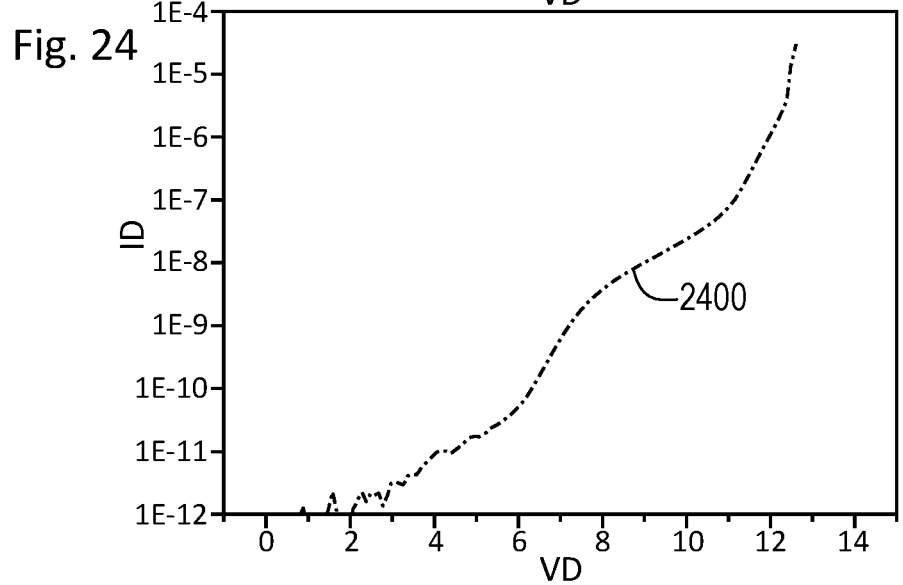
Figure 25:
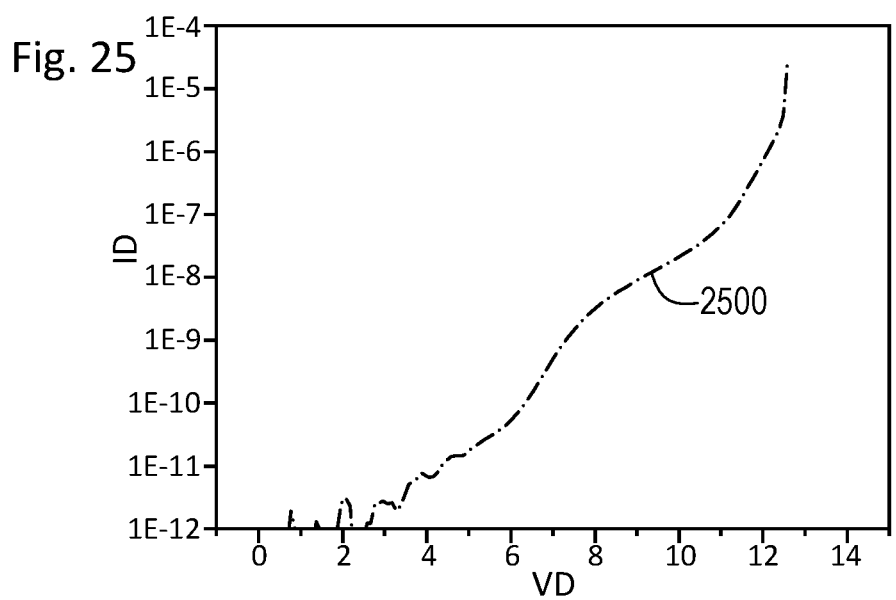

FIG. 19 shows the simplified schematic diagram of the thyristor 100 of FIG. 1, but with optional trigger elements (e.g., NMOS trigger elements 1901-1905), with connections shown in dashed lines for various embodiments. Although all of the optional trigger elements 1901-1905 are shown in the same drawing, it is understood, however, that not all would be used at the same time. For example, the optional trigger element 1901 is a "top" trigger connected between the P-type emitter 103 and the P-type base/collector 107/108. The optional trigger element 1902 is a "middle" trigger connected between the P-type base/collector 107/108 and the N-type base/collector 105/106. The optional trigger element 1903 is a "bottom" trigger connected between the N-type base/collector 105/106 and the N-type emitter 104. The optional trigger element 1904 is an NMOS based electrostatic discharge (ESD) protection diode for use in some embodiments with the top trigger element 1901 and is connected between the N-type emitter 104 and the P-type base/collector 107/108. The optional trigger element 1905 is an NMOS based ESD diode for use in some embodiments with the bottom trigger element 1903 and is connected between the P-type emitter 103 and the N-type base/collector 105/106. The NMOS based ESD diode trigger elements 1904 and 1905 enable bidirectionality for the thyristor. Additionally, instead of the NMOS trigger elements shown, alternative embodiments may use any appropriate trigger elements, such as a chain of forward biased diodes (e.g., with each diode providing about 0.7 volts, which can be stacked depending on design requirements) or one or more Zener diodes. Some of these types of trigger elements are difficult to implement in a bulk semiconductor design, but the design of the thyristor 100 enables tremendous flexibility in the use of any of these types of trigger elements in a bulk implementation or SOI implementation. Furthermore, although not shown, some of the trigger elements may be provided with resistors (e.g., between the bases and emitters of the thyristor 100) to enable turning off the thyristor 100 and fine tuning of the trigger parameters.

Figure 26:
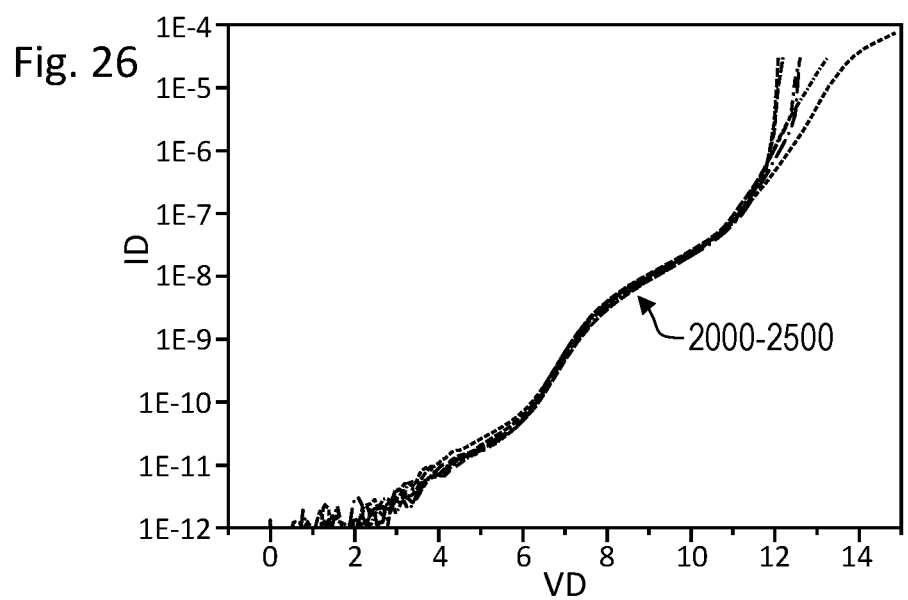

FIGS. 20-25 show simplified current-voltage (I-V) graphs 2000, 2100, 2200, 2300, 2400 and 2500 indicating the performance of an example horizontal or lateral thyristor device formed with a plurality of the thyristor tiles (e.g., each similar to the thyristor tile 200) in an SCR configuration and with or without different ones or combinations of the trigger elements 1901-1905 (FIG. 19), in accordance with some embodiments. Each graph 2000-2500, thus, corresponds to a different trigger configuration. FIG. 26 shows all of the I-V graphs 2000-2500 together for comparison. The I-V graphs 2000-2500 are provided with a logarithmic scale for the current (ID) and a linear scale for the voltage (VD) and were generated with a DC I-V sweep from about 0-1 volts to about 12-15 volts.

The I-V graph 2000 was generated with an example thyristor device not using any of the trigger elements 1901-1905. The I-V graph 2100 was generated with an example thyristor device using only the top trigger element 1901. The I-V graph 2200 was generated with an example thyristor device using the top trigger element 1901 in combination with the NMOS based ESD diode trigger element 1904. The I-V graph 2300 was generated with an example thyristor device using only the middle trigger element 1902. The I-V graph 2400 was generated with an example thyristor device using only the bottom trigger element 1903. The I-V graph 2500 was generated with an example thyristor device using the bottom trigger element 1903 in combination with the NMOS based ESD diode trigger element 1905. The I-V graphs 2000-2500 demonstrate that the thyristor performs very similarly with each trigger configuration up to about 12 volts. The I-V graphs 2000-2500 in FIGS. 20-26, thus, demonstrate that the thyristor devices formed with a plurality of the thyristor tiles 200 can be implemented with the trigger elements 1901-1905, as needed to control the trigger voltage, with excellent results.

FIG. 27 shows a simplified flowchart for a process 2700 for forming the thyristor devices with the thyristor tiles 200, in accordance with one or more example embodiments. The particular steps, combination of steps, and order of the steps are provided for illustrative purposes only. Other processes with different steps, combinations of steps, or orders of steps can also be used to achieve the same or similar result. Features or functions described for one of the steps may be performed in a different step in some embodiments. Furthermore, additional steps not explicitly shown or described may be performed before or after or as a sub-portion of the steps shown. Additionally, the above description of the thyristor device (e.g., with the thyristor tiles 200 and the electrical interconnect or metal layers 800, 900, 1000 and 1100) and the following process 2700 for the formation thereof illustrate that, in some embodiments, the thyristor device can be formed as part of or within an overall CMOS process flow without the use of additional masks or changes to the conventional process flow. Thus, the thyristor device can be formed along with or simultaneously with MOSFET devices (or portions thereof) of the overall electronic circuit or integrated circuit. The ability to be formed as part of a conventional CMOS process flow provides a significant advantage (over many prior art thyristor designs and formation processes) for incorporating the thyristor device into the overall electronic circuit or integrated circuit. For example, the lack of additional masks or process changes means that the inclusion of the thyristor device in the overall electronic circuit does not require any additional costs or fabrication time.

Upon starting, a semiconductor wafer is provided (at 2701). In some embodiments, the semiconductor wafer is already a fully formed SOI wafer at this point. In some embodiments, the semiconductor wafer is a bulk semiconductor wafer, i.e., without a buried oxide of an SOI wafer. In some embodiments, providing the semiconductor wafer at 2701 includes forming a buried oxide layer (e.g., for the BOX layer 301 in FIGS. 3 and 4) on a substrate (e.g., the underlying substrate 302 in FIGS. 3 and 4) and forming a semiconductor layer (e.g., an intrinsic layer, N-minus layer, or P-minus layer into and onto which the above described active layer is to be formed) on the buried oxide layer (e.g., by epitaxial growth or layer transfer techniques), thereby forming an SOI wafer.

Some of the subsequent structure formation steps are performed, for example, by patterning a photoresist over the semiconductor layer and implanting dopants of the appropriate N and P conductivity to form the active region of the thyristor tile 200. Additionally, these formation steps can be performed in conjunction with forming other structures or components (e.g., of MOSFETs) of the overall electronic circuit or integrated circuit of which the resulting horizontal or lateral thyristor device is a part.

At 2702, to begin forming the active region, an N-well is formed as a base region (e.g., the N-well base regions 201*d* and 202*d* in FIGS. 2-4) in the semiconductor layer for the PNP tiles 201 and 202. At 2703, a P-well is formed as a base region (e.g., the P-well base regions 203*d* and 204*d* in FIGS. 2-4) in the semiconductor layer for the NPN tiles 203 and 204. Alternatively, (at 2701-2703) one of the two wells (N-well or P-well) is provided or formed as an initial N-minus or P-minus epitaxial layer (e.g., as the semiconductor layer on top of the BOX layer 301) that also forms a semiconductor layer into and onto which the MOSFETs of the overall electronic circuit are also formed. The other of the two wells is then formed by appropriate implantation of the opposite P or N type dopant.

At 2704, regions of the field oxide 303 are formed on the active region of the thyristor tile 200. Additionally, areas of the field oxide 303 are removed from portions of locations where the emitter regions 201*a*, 202*a*, 203*a* and 204*a* and the base/collector regions 201*b/c*, 202*b/c*, 203*b/c* and 204*b/c* (or the connector regions associated therewith) will be, so that subsequent processing steps can implant or deposit dopants or materials through these openings in the field oxide 303.

At 2705, N-type regions (e.g., for the N-type base/collector regions 201*b/c* and 202*b/c* and the N-type emitter regions 203*a* and 204*a* in FIGS. 2-4) are formed by N dopant implantation within the N-well and P-well base regions 201*d*, 202*d*, 203*d* and 204*d*, e.g., at the appropriate removed portions of the field oxide 303. At 2706, N+ regions (e.g., for the N+ base/collector connector regions, such as 202*j/k*, and the N+ emitter connector region, such as 204*i*) are formed by additional N dopant implantation within the N-type base/collector regions 201*b/c* and 202*b/c* and the N-type emitter regions 203*a* and 204*a*.

At 2707, P-type regions (e.g., for the P-type base/collector regions 203*b/c* and 204*b/c* and the P-type emitter regions 201*a* and 202*a* in FIGS. 2-4) are formed by P dopant implantation within the N-well and P-well base regions 201*d*, 202*d*, 203*d* and 204*d*, e.g., at the appropriate removed portions of the field oxide 303. At 2708, P+ regions (e.g., for the P+ base/collector connector regions, such as 204*j/k*, and the P+ emitter connector region, such as 201*i* and 202*i*) are formed by additional P dopant implantation within the P-type base/collector regions 203*b/c* and 204*b/c* and the P-type emitter regions 201*a* and 202*a*.

Figure 9:
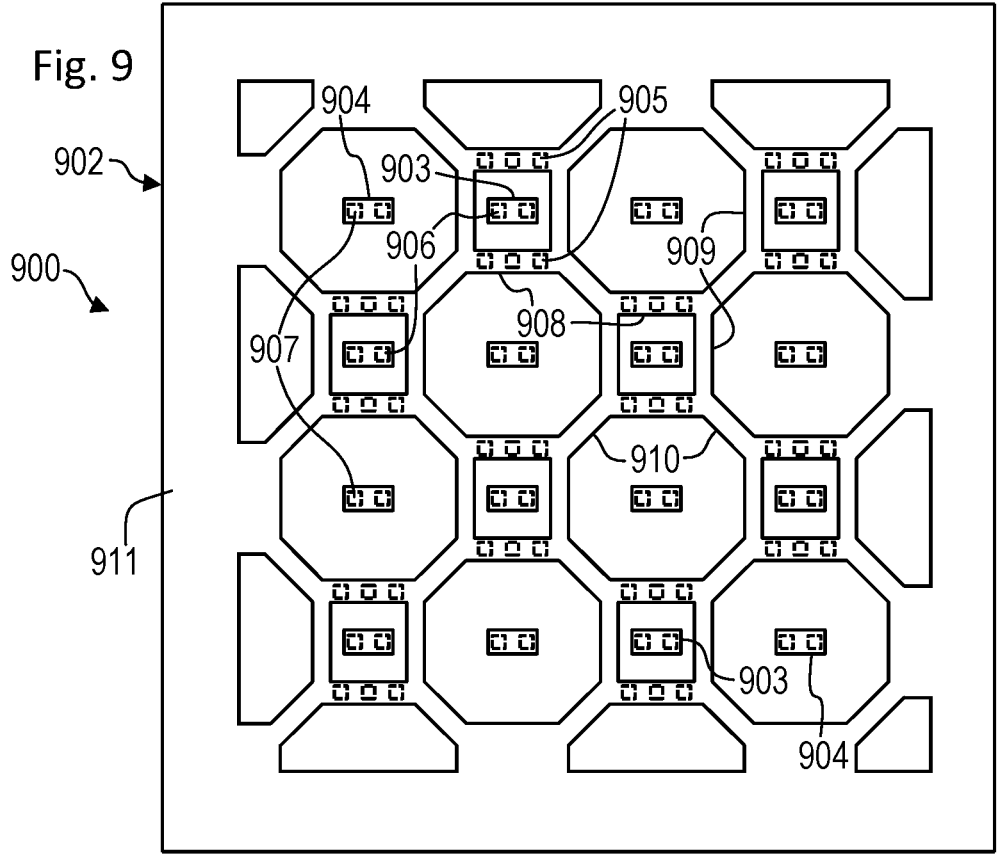
Figure 10:
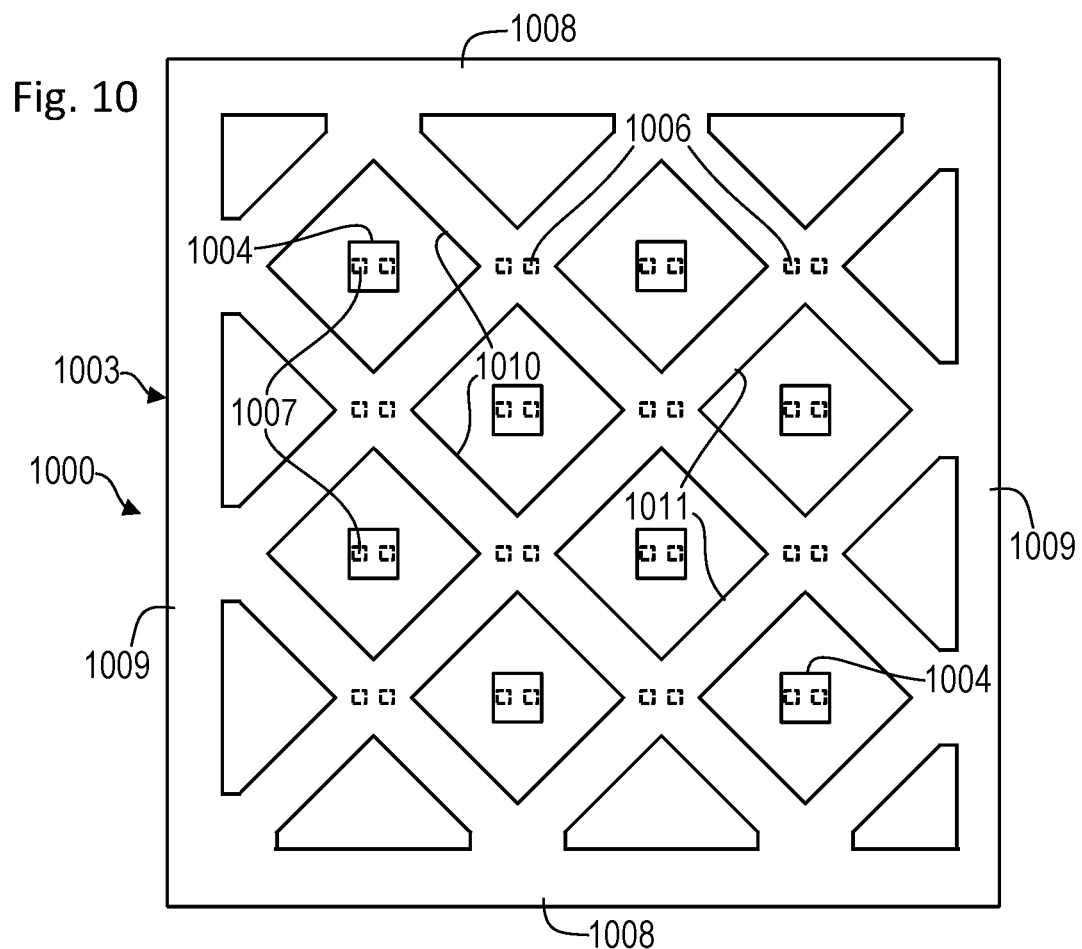
Figure 11:
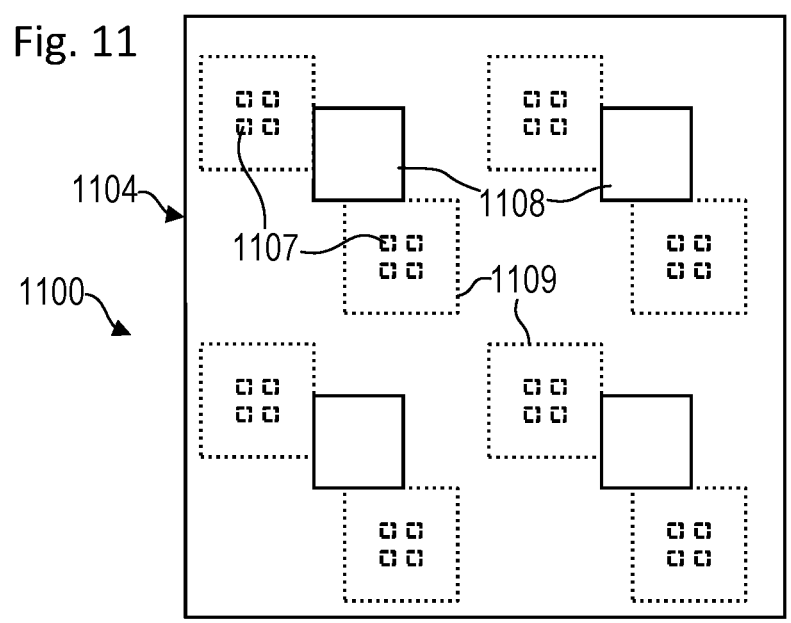

At 2709, electrically conductive material (e.g., metals, etc.) can be deposited to form the emitter and base/collector contacts 201*e/f/g*, 202*e/f/g*, 203*e/f/g* and 204*e/f/g* on the connector regions (such as 201*i*, 202*i/j/k*, 204*i/j/k*, and others not shown or labeled in the drawings). At 2710, the series of alternating insulator layers (with electrically conductive vias therethrough, e.g., as shown in FIGS. 9-11) and electrically conductive interconnect layers (e.g., the electrical interconnect or metal layers 800, 900, 1000 and 1100, as shown in FIGS. 8-11) are formed, thereby electrically connecting the thyristor tiles 200 through the contacts 201*e/f/g*, 202*e/f/g*, 203*e/f/g* and 204*e/f/g* to the other structures or components of the overall electronic circuit or integrated circuit of which the resulting horizontal or lateral thyristor device is a part. The overall electronic circuit or integrated circuit is further processed into an integrated circuit package.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A thyristor tile comprising:
   first and second PNP tiles, each of which is formed within a respective N-well base; and
   first and second NPN tiles, each of which is formed within a respective P-well base;
   wherein:
   each PNP tile is adjacent to both NPN tiles;
   each NPN tile is adjacent to both PNP tiles; and
   the P-well bases are adjacent to the N-well bases, except at a corner between the N-well bases and the P-well bases.

2. The thyristor tile of claim 1, wherein:
   the first and second PNP tiles have a first orientation; and
   the first and second NPN tiles have a second orientation that is perpendicular to the first orientation.

3. The thyristor tile of claim 2, wherein:
   each of the first and second PNP tiles have an N-type base region and a P-type emitter region aligned in the first orientation; and
   each of the first and second NPN tiles have a P-type base region and an N-type emitter region aligned in the second orientation.

4. The thyristor tile of claim 3, wherein:
   each N-type base region is aligned in the first orientation with the N-type emitter region of one of the first and second NPN tiles and is an N-type collector region of that NPN tile; and each P-type base region is aligned in the second orientation with the P-type emitter region of one of the first and second PNP tiles and is a P-type collector region of that PNP tile.

5. The thyristor tile of claim 3, wherein:
the aforementioned N-type base region is a first N-type base region;
the aforementioned P-type base region is a first P-type base region;
the first and second PNP tiles each have a second N-type base region aligned in the first orientation with the first N-type base region and the P-type emitter region; and
the first and second NPN tiles each have a second P-type base region aligned in the second orientation with the first P-type base region and the N-type emitter region.

6. The thyristor tile of claim 5, further comprising:
a first interconnect layer that electrically connects the N-type base regions of the first and second PNP tiles;
a second interconnect layer that electrically connects the P-type base regions of the first and second NPN tiles;
a third interconnect layer that electrically connects the N-type emitter regions of the first and second NPN tiles; and
a fourth interconnect layer that electrically connects the P-type emitter regions of the first and second PNP tiles.

7. The thyristor tile of claim 6, wherein:
the thyristor tile is formed with a horizontal longitudinal dimension and a horizontal lateral dimension;
the first interconnect layer includes 1) first island traces that electrically connect to the P-type emitter regions, 2) second island traces that electrically connect to the N-type emitter regions, 3) third island traces that electrically connect to the P-type base regions, and 4) first lateral, longitudinal and diagonal traces that electrically connect to the N-type base regions and that surround the first, second and third island traces;
the second interconnect layer includes 1) fourth island traces that electrically connect to the P-type emitter regions, 2) fifth island traces that electrically connect to the N-type emitter regions, and 3) second lateral, longitudinal and diagonal traces that electrically connect to the P-type base regions and that surround the fourth and fifth island traces; and
the third interconnect layer includes 1) sixth island traces that electrically connect to the P-type emitter regions, and 2) first and second sets of diagonal traces that electrically connect to the N-type emitter regions that are aligned along the same diagonals and that surround the sixth island traces.

8. The thyristor tile of claim 7, wherein:
the first lateral, longitudinal and diagonal traces form first rectangular structures that surround the first island traces and form first octagonal structures that surround the second and third island traces;
the second lateral, longitudinal and diagonal traces form second rectangular structures that surround the fifth island traces and form second octagonal structures that surround the fourth island traces; and
the first and second sets of diagonal traces form rhombus structures that surround the sixth island traces.

9. The thyristor tile of claim 1, wherein:
the first PNP tile is in a first quadrant of the thyristor tile;
the first NPN tile is in a second quadrant of the thyristor tile, the second quadrant being located adjacent to the first quadrant;
the second PNP tile is in a third quadrant of the thyristor tile, the third quadrant being located adjacent to the second quadrant, and the third quadrant being diagonally located from the first quadrant; and
the second NPN tile is in a fourth quadrant of the thyristor tile, the fourth quadrant being located adjacent to the first and third quadrants, and the fourth quadrant being diagonally located from the second quadrant.

10. A thyristor comprising a plurality of the thyristor tile of claim 9, wherein:
the first NPN tile in the second quadrant of a first one of the plurality of the thyristor tile is located adjacent to the first PNP tile in the first quadrant of a second one of the plurality of the thyristor tile; and
a first N-type base region of the first PNP tile in the first quadrant of the second one of the plurality of the thyristor tile is a first N-type collector region of the first NPN tile in the second quadrant of the first one of the plurality of the thyristor tile.

11. The thyristor of claim 10, wherein:
the first NPN tile in the second quadrant of the first one of the plurality of the thyristor tile is located adjacent to the second PNP tile in the third quadrant of a third one of the plurality of the thyristor tile; and
a first P-type base region of the first NPN tile in the second quadrant of the first one of the plurality of the thyristor tile is a first P-type collector region of the second PNP tile in the third quadrant of the third one of the plurality of the thyristor tile.

12. A thyristor comprising:
a plurality of PNP tiles, each of which is formed within a respective N-well base; and
a plurality of NPN tiles, each of which is formed within a respective P-well base;
wherein the PNP tiles and NPN tiles are arranged in an alternating configuration in both rows and columns; and
wherein the P-well bases are adjacent to the N-well bases, except at a corner between the N-well bases and the P-well bases.

13. The thyristor of claim 12, wherein:
each PNP tile is adjacent to at least two of the NPN tiles; and
each NPN tile is adjacent to at least two of the PNP tiles.

14. The thyristor of claim 12, wherein:
each PNP tile has at least one base region that is also a collector region of an adjacent NPN tile; and
each NPN tile has at least one base region that is also a collector region of an adjacent PNP tile.

15. The thyristor of claim 12, wherein:
the PNP tiles have a first orientation; and
the NPN tiles have a second orientation that is perpendicular to the first orientation.

16. The thyristor of claim 15, wherein:
each PNP tile has first and second N-type base regions and a P-type emitter region, the P-type emitter region being located between the first and second N-type base regions, and the first and second N-type base regions and the P-type emitter region being aligned in the first orientation; and
each NPN tile has first and second P-type base regions and an N-type emitter region, the N-type emitter region being located between the first and second P-type base regions, and the first and second P-type base regions and the N-type emitter region being aligned in the second orientation.

17. The thyristor of claim 16, wherein:
at least one of the first and second N-type base regions of each PNP tile is aligned in the first orientation with the N-type emitter region of an adjacent one of the NPN tiles;
the at least one of the first and second N-type base regions of each PNP tile is also an N-type collector region of the adjacent one of the NPN tiles;
at least one of the first and second P-type base regions of each NPN tile is aligned in the second orientation with the P-type emitter region of an adjacent one of the PNP tiles; and
the at least one of the first and second P-type base regions of each NPN tile is also a P-type collector region of the adjacent one of the PNP tiles.

18. The thyristor of claim 17, further comprising:
a first interconnect layer that electrically connects the N-type base regions of the PNP tiles and the N-type collector regions of the NPN tiles, the first interconnect layer including first traces that surround the P-type emitter regions, the N-type emitter regions, and the P-type base regions in a first plane vertically offset therefrom;
a second interconnect layer that electrically connects the P-type base regions of the NPN tiles and the P-type collector regions of the PNP tiles, the second interconnect layer including second traces that surround the P-type emitter regions and the N-type emitter regions in a second plane vertically offset therefrom;
a third interconnect layer that electrically connects the N-type emitter regions of the NPN tiles, the third interconnect layer including third traces that surround the P-type emitter regions in a third plane vertically offset therefrom; and
a fourth interconnect layer that electrically connects the P-type emitter regions of the PNP tiles.

19. The thyristor of claim 18, wherein:
the first traces form first rectangular structures that surround the P-type emitter regions and form first octagonal structures that surround the N-type emitter regions and the P-type base regions;
the second traces form second rectangular structures that surround the N-type emitter regions and form second octagonal structures that surround the P-type emitter regions; and
the third traces include diagonal traces that form rhombus structures that surround the P-type emitter regions.

20. The thyristor of claim 18, wherein:
the first, second, third and fourth interconnect layers are configured to receive an electrical connection thereto at any point along any peripheral side thereof for electrical interconnections to other electronic components of an overall electronic circuit of which the thyristor is a part.

21. The thyristor of claim 12, wherein:
the PNP tiles and the NPN tiles are formed within a CMOS process flow simultaneously with portions of MOSFET devices of an overall electronic circuit of which the thyristor is a part.

* * * * *